(12) United States Patent
Grandidge et al.

(10) Patent No.: US 9,606,318 B2
(45) Date of Patent: Mar. 28, 2017

(54) CABLE MANAGEMENT PLATE ASSEMBLY AND ASSOCIATED SYSTEMS AND METHODS

(71) Applicant: Ortronics, Inc., New London, CT (US)

(72) Inventors: Ryan J. Grandidge, Westerly, RI (US); Rudolph A. Montgelas, West Hartford, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 14/683,786

(22) Filed: Apr. 10, 2015

(65) Prior Publication Data

US 2015/0362692 A1    Dec. 17, 2015

Related U.S. Application Data

(60) Provisional application No. 62/013,079, filed on Jun. 17, 2014.

(51) Int. Cl.
*G02B 6/00* (2006.01)
*H05K 7/16* (2006.01)
*G02B 6/44* (2006.01)
*G02B 6/38* (2006.01)
*H04Q 1/06* (2006.01)

(52) U.S. Cl.
CPC .......... *G02B 6/4452* (2013.01); *G02B 6/4455* (2013.01); *G02B 6/3897* (2013.01); *G02B 6/4457* (2013.01); *H04Q 1/06* (2013.01)

(58) Field of Classification Search
CPC .. G02B 6/4452; G02B 6/4453; G02B 6/4455; G02B 6/3897

USPC .......................... 385/134–136; 361/725–727
See application file for complete search history.

(56) References Cited

U.S. PATENT DOCUMENTS

| | | | |
|---|---|---|---|
| 5,922,997 A * | 7/1999 | Lecinski | H05K 7/1448 174/135 |
| 6,968,647 B2 | 11/2005 | Levesque et al. | |
| 7,225,586 B2 | 6/2007 | Levesque et al. | |
| 7,697,811 B2 * | 4/2010 | Murano | G02B 6/4452 385/134 |
| 7,983,038 B2 | 7/2011 | Levesque et al. | |
| 8,106,311 B2 | 1/2012 | Larsen et al. | |

(Continued)

OTHER PUBLICATIONS

U.S. Appl. No. 14/683,433, filed Apr. 10, 2015.

(Continued)

*Primary Examiner* — Robert Tavlykaev
(74) *Attorney, Agent, or Firm* — McCarter & English, LLP

(57) ABSTRACT

Exemplary embodiments are directed to cable management plate assemblies for a media patching system or a rack. The cable management plate assemblies include a lower cable management plate and an upper cable management plate. The upper cable management plate can be slidably secured to the lower cable management plate. In a first configuration, the upper cable management plate is disposed in a retracted position relative to the lower cable management plate. In a second configuration, the upper cable management plate is disposed in an extended position relative to the lower cable management plate. Embodiments are also directed to methods of supporting one or more cables in a media patching system or a rack, and associated media patching systems.

20 Claims, 37 Drawing Sheets

(56) References Cited

U.S. PATENT DOCUMENTS

| | | | |
|---|---|---|---|
| 8,130,494 B2 | 3/2012 | Larsen et al. | |
| 8,184,938 B2 | 5/2012 | Cooke et al. | |
| 8,398,039 B2 | 3/2013 | Murano et al. | |
| 8,439,702 B2 | 5/2013 | Dietz et al. | |
| 8,526,181 B2 | 9/2013 | Levesque et al. | |
| 8,630,094 B2* | 1/2014 | Hsiao | H05K 7/1489 361/726 |
| 8,672,709 B2 | 3/2014 | Dietz et al. | |
| 8,731,364 B2 | 5/2014 | Murano et al. | |
| 8,758,047 B2 | 6/2014 | Dietz et al. | |
| 2009/0067800 A1* | 3/2009 | Vazquez | G02B 6/4455 385/135 |
| 2009/0129014 A1 | 5/2009 | Larsen et al. | |
| 2014/0206273 A1 | 7/2014 | Larsen et al. | |

OTHER PUBLICATIONS

U.S. Appl. No. 14/683,503, filed Apr. 10, 2015.
U.S. Appl. No. 14/683,569, filed Apr. 10, 2015.
U.S. Appl. No. 14/683,723, filed Apr. 10, 2015.
U.S. Appl. No. 14/683,786, filed Apr. 10, 2015.
U.S. Appl. No. 14/304,079, filed Jun. 13, 2014.
U.S. Appl. No. 62/013,079, filed Jun. 17, 2014.

* cited by examiner

CABLE MANAGEMENT PLATE ASSEMBLY AND ASSOCIATED SYSTEMS AND METHODS

CROSS-REFERENCE TO RELATED APPLICATIONS

The present application claims the benefit of a provisional patent application entitled "Hybrid Patch Panel Assembly For Multiple Media Connections," which was filed on Jun. 17, 2014, and assigned Ser. No. 62/013,079. The entire content of the foregoing provisional application is incorporated herein by reference.

TECHNICAL FIELD

The present disclosure relates to patch panel assemblies/patching systems configured to support multiple media connections and, more particularly, to cable management plate assemblies for patch panel assemblies/patching systems which support and provide convenient access to high density, multiple media connections.

BACKGROUND in general, devices for interfacing with high frequency data transfer media are known. See, e.g., U.S. Pat. Nos. 8,439,702 and 8,672,709, the entire contents of each being hereby incorporated by reference in their entireties.

For example, connectors or jack assemblies having a plurality of contacts (e.g., modular communication jacks) have been developed that facilitate communication with contacts in connecting assemblies (e.g., plug connectors) that, in turn, interact with various media (e.g., copper-based media such as unshielded twisted pair (UTP) media, fiber optic cables, etc.). The jack assembly contacts are typically positioned for communication with data signal transmission media plug elements/contacts introduced to a receiving space of the jack assembly.

In general, many data transfer media include multiple pairs of lines bundled together. Communications systems typically incorporate such media (e.g., UTP media, fiber optic cables, etc.) and connectors (e.g., jack/plug combinations) for data transfer. For example, a plurality of jack assemblies/housings may be positioned adjacent one another in a multi-gang jack panel or the like, with each jack assembly/housing releasably secured and/or attached to the jack panel.

In general, commercial buildings require an effective and efficient telecommunications infrastructure to support the wide variety of services that rely on the transport of information. Typically, wiring systems within buildings are terminated at a location where they may be interconnected with one another and/or to other cabling systems or telecommunications equipment. Cables are often terminated on wire panels or patch panels which can be mounted to racks or to some other location/structure.

Patch panels are known in the field of data communication systems. See, e.g., U.S. Pat. No. 8,106,311, the entire content of which is hereby incorporated by reference in its entirety. Other exemplary assemblies/systems in this general field are described and disclosed in U.S. Pat. Nos. 7,697,811; 7,983,038; 8,184,938; 8,398,039; and U.S. Patent Pub. Nos. 2012/0064760 and 2013/0129296, the entire contents of each being hereby incorporated by reference in their entireties.

A patch panel generally provides a plurality of network ports incorporated into a structural element that connect incoming and outgoing lines of a communication/electrical system (e.g., a local area network (LAN) or the like). Typical patch panels are mounted hardware units that include a plurality of port locations and utilize cables for interconnections. A patch panel can use patch cords to create the interconnections. Patch panel systems are generally intended to facilitate organization and management in implementing telecommunications wiring systems (e.g., for high speed data networks).

In general, many rows of cabinets or racks typically fill a data center or telecommunications room. Patch panels affixed to a rack and/or a wall of a telecommunications room provide convenient access to telecommunication devices (e.g., servers) within the rack or room. As the demand for the use of telecommunication devices grows, space for such devices becomes limited and/or expensive. A constant need exists among manufacturers to develop patch panel assemblies/patching systems that include improved features and structures.

For example, patch panels generally define an enclosure for a plurality of cables, including a front portion with a plurality of network ports and a rear portion from which a plurality of cables extend for connecting to parts of a communication network. Some patch panels include a bottom surface for supporting the cables extending from the rear of the patch panel. However, to access the cables at the rear of the patch panel and supported by the bottom surface, it is generally necessary to detach the entire patch panel from the rack or wall of the telecommunications room and slide the patch panel out of the rack. The removal of the entire patch panel can take a significant amount of time, particularly when access to multiple cables is desired at different patch panels, thereby increasing installation or maintenance costs. In addition, removing the entire patch panel can inadvertently dislodge and/or disconnect one or more cables, increasing connection/performance issues and maintenance times.

Thus, a need exists for patch panel system(s) that include, inter cilia, cable management plate assemblies which provide convenient and reliable access to cables at the rear of the patch panel(s). These and other needs are addressed by the cable management plate assemblies and associated systems and methods of the present disclosure.

SUMMARY

The present disclosure provides advantageous patch panel assemblies/patching systems, and improved methods for using the same. In accordance with embodiments of the present disclosure, exemplary cable management plates for a media patching system or rack are provided, the media patching system or rack including frame members. The cable management plates include a body defining a supporting surface for one or more cables. The body includes two side edges. The cable management plate includes a flange extending from each of the side edges of the body. The cable management plate further includes an elongated slot formed in each flange. The cable management plate can be configured to slide along the elongated slots relative to the media patching system or the rack. In particular, the cable management plate can slide along the elongated slots at least partially out of the media patching system or the rack.

The elongated slot includes a proximal end and a distal end. In some embodiments, the proximal end can define a rounded edge. In some embodiments, the distal end can define an angled point. The cable management plate can be configured to pivot at the proximal end of the elongated slots relative to the media patching system or the rack. In some embodiments, the body can include one or more tabs formed therein for securing the one or more cables to the body with, e.g., VELCRO® straps, or the like. In some embodiments, the body can include slots formed therein for detachably receiving spools. The cable management plates can include fastening members that releasably secure the cable management plate to the media patching system or the rack. The cable management plates can include fastening members including a cam lock mechanism that releasably secure a position of the cable management plate along the elongated slots relative to the media patching system or the rack.

In accordance with embodiments of the present disclosure, exemplary methods of supporting and organizing one or more cables in a media patching system or a rack are provided. The methods include slidably securing the cable management plates as described herein to the media patching system or the rack. The methods further include sliding the cable management plate along the elongated slots relative to the media patching system or the rack. In some embodiments, the methods include pivoting the cable management plate relative to the media patching system or the rack. The methods include detachably securing the cable management plate to the media patching system or the rack with fastening members including a cam lock mechanism.

In accordance with embodiments of the present disclosure, exemplary media patching systems are provided that include a patch panel enclosure and a cable management plate. The patch panel enclosure can include frame members. The cable management plate can include the components described herein and can be configured to slide along the elongated slots relative to the patch panel enclosure.

The cable management plate can be configured to slide along the elongated slots at least partially out of the patch panel enclosure. In some embodiments, the cable management plate can be configured to pivot at the proximal end of the elongated slots relative to the patch panel enclosure. The patch panel enclosure can include first and second frame members. In some embodiments, the cable management plate can be detachably secured to the first and second frame members. The cable management plate can slide along the elongated slots relative to the patch panel enclosure independently from movement of the first and second frame members and patching connections within the patch panel enclosure.

In some embodiments, the systems can include a quick release for attaching and detaching brackets to frame members of the patch panel enclosure. The systems can include a lower cable management plate and brackets. The lower cable management plate can include holes complementary to the elongated slots of the cable management plate. The lower cable management plate and the brackets can detachably secure the cable management plate to the patch panel enclosure.

In accordance with embodiments of the present disclosure, exemplary cable management plate assemblies for a media patching system or a rack are provided. The cable management plate assemblies can include a lower cable management plate and an upper cable management plate. The upper cable management plate can be slidably secured to the lower cable management plate. In a first configuration, the upper cable management plate can be disposed in a retracted position relative to the lower cable management plate. In a second configuration, the upper cable management plate can be disposed in an extended position relative to the lower cable management plate. It should be understood that the upper cable management plate can slide and be disposed in positions between the retracted and extended positions.

The upper cable management plate can include a body defining a supporting surface and two side edges. A flange can extend from each of the side edges of the body and an elongated slot can be formed in each flange. The cable management plate assemblies can include fastening members passing through the elongated slots and secured to the lower cable management plate. The upper cable management plate can slide along the fastening members relative to the lower cable management plate. In the retracted position, the upper cable management plate can be slidably retracted relative to the lower cable management plate such that the fastening members are disposed adjacent to a distal end of the elongated slots. In the extended position, the upper cable management plate can be slidably extended relative to the lower cable management plate such that the fastening members are disposed adjacent to a proximal end of the elongated slots. In some embodiments, in the extended position, the upper cable management plate can rotate about the fastening members.

In some embodiments, the fastening members can include a cam lock mechanism disposed therein that includes a first cam portion and a second cam portion. The first cam portion and the second cam portion can interact to prevent and allow sliding of the upper cable management plate relative to the lower cable management plate. In particular, the first cam portion can be configured to impart a force on the second cam portion to create a friction force on the upper cable management plate. The friction force imparted by the second cam portion on the flange of the upper cable management plate can prevent sliding of the upper cable management plate relative to the lower cable management plate. Removal of the force imparted by the first cam portion on the second cam portion can remove the friction force on the upper cable management plate, thereby allowing sliding motion of the upper cable management plate relative to the lower cable management plate.

In some embodiments, the upper cable management plate can include a tab formed therein for securing the one or more cables to the body. In some embodiments, the upper cable management plate can include slots formed therein for detachably receiving one or more spools (or quarter spools). The lower cable management plate can include two side flanges including holes that are spaced to allow the cable management plate assembly to be fixedly secured to either a patch panel enclosure or a rack.

In accordance with embodiments of the present disclosure, exemplary methods of supporting one or more cables in a media patching system or a rack are provided that include securing a cable management assembly to the media patching system or the rack. The cable management assembly can include an upper cable management plate slidably secured to a lower cable management plate. The methods include sliding the upper cable management plate relative to the lower cable management plate into a retracted position. The methods include sliding the upper cable management plate relative to the lower cable management plate into an extended position.

The methods can include pivoting the upper cable management plate relative to the lower cable management plate. The methods include securing fastening members to the lower cable management plate such that the fastening members extend through elongated slots of the upper cable management plate. The upper cable management plate can thereby slide along the fastening members relative to the lower cable management plate. The fastening members can include a cam lock mechanism including a first cam portion and a second cam portion. The methods can include imparting a force on the second cam portion with the first cam portion to create a friction force on the upper cable management plate. The friction force can prevent sliding of the upper cable management plate relative to the lower cable management plate.

The methods can include locking the position of the upper cable management plate relative to the lower cable management plate. In some embodiments, the methods can include locking the position of the upper cable management plate relative to the lower cable management plate by rotating one member of a cam lock mechanism to create a friction force on the upper cable management plate.

In accordance with embodiments of the present disclosure, exemplary media patching systems are provided that include a patch panel enclosure and a cable management panel assembly disposed within the patch panel enclosure. The cable management plate assembly can include a lower cable management plate and an upper cable management plate slidably secured to the lower cable management plate. In a first configuration, the upper cable management plate can be disposed in a retracted position relative to the lower cable management plate and the patch panel enclosure. In a second configuration, the upper cable management plate can be disposed in an extended position relative to the lower cable management plate and the patch panel enclosure.

In some embodiments, the lower cable management plate can be fixedly secured within the patch panel enclosure and the upper cable management plate can slide between the retracted position and the extended position relative to the lower cable management plate and the patch panel enclosure to provide greater access to cables supported by the cable management plate assembly. In some embodiments, the lower cable management plate can be fixedly secured to the first and second frame members of the patch panel enclosure and the upper cable management plate can slide between the retracted position and the extended position relative to the lower cable management plate and the patch panel enclosure.

The system can include a first bracket fixedly secured to the first frame member through a spring-loaded pin. The system can include a second bracket fixedly secured to the second frame member through a spring-loaded pin. The lower cable management plate can be fixedly secured to the first and second frame members through the first and second brackets. The upper cable management plate can include a body defining a supporting surface. The body can include two side edges, a flange extending from each of the side edges of the body, and an elongated slot formed in each flange. The system can include fastening members passing through the elongated slots and secured to the lower cable management plate. The upper cable management plate can thereby slide along the fastening members relative to the lower cable management plate.

In exemplary embodiments, the present disclosure provides advantageous patch panel assemblies configured to support multiple media connections, and related methods of use. More particularly, the present disclosure provides improved systems/methods for the design and use of hybrid patch panel assemblies configured to support high density, multiple mixed media connections.

In exemplary embodiments, disclosed herein is a high density patching assembly/system configured to support multiple mixed media connections. In certain embodiments, the improved systems/assemblies of the present disclosure provide users with the ability to install multiple mixed media connections (e.g., both copper-based and fiber optic connections) in the same patching system/enclosure. In some embodiments, high density jack patch panels are utilized in the systems/assemblies of the present disclosure to support multiple media connections (e.g., high density, multiple mixed media connections, such as both copper and fiber optic connections). Exemplary patch panel assemblies disclosed herein advantageously increase the patching density of the systems/assemblies of the present disclosure, and provide improved access to the mixed media connectors and cabling elements.

The present disclosure provides for a media patching system including a multi-connector panel assembly having a multi-connector panel surface, the multi-connector panel surface including a plurality of apertures; a fiber optic connector assembly mounted with respect to a first aperture of the plurality of apertures of the multi-connector panel surface; and a copper-based connector assembly mounted with respect to a second aperture of the plurality of apertures of the multi-connector panel surface.

The present disclosure also provides for a media patching system wherein the multi-connector panel surface is angled. The present disclosure also provides for a media patching system wherein the multi-connector panel surface is substantially flat or planar.

The present disclosure also provides for a media patching system wherein the fiber optic connector assembly is mounted with respect to a first plurality of apertures of the plurality of apertures of the multi-connector panel surface; and wherein a plurality of copper-based connector assemblies are mounted with respect to a second plurality of apertures of the plurality of apertures of the multi-connector panel surface.

The present disclosure also provides for a media patching system wherein the copper-based connector assembly includes a jack housing that is adapted to receive signals from a mating connecting assembly or plug connector. The present disclosure also provides for a media patching system wherein the fiber optic connector assembly includes one or more ports/adapters to facilitate communication with a mating fiber optic connector.

The present disclosure also provides for a media patching system wherein the fiber optic connector assembly is a fiber optic cassette. The present disclosure also provides for a media patching system wherein the fiber optic cassette includes six port housings, with each port housing including two fiber optic ports/adapters. The present disclosure also provides for a media patching system wherein each port housing is configured to be mounted with respect to an aperture of the multi-connector panel surface.

The present disclosure also provides for a media patching system wherein the multi-connector panel assembly is mounted with respect to a first frame member and a second frame member; and wherein the first and second frame members are mounted with respect to a tray member and to a door assembly. The present disclosure also provides for a media patching system wherein a top cover and a bottom cover are mounted with respect to the first and second frame members.

The present disclosure also provides for a media patching system wherein the first aperture of the multi-connector panel surface is associated with two mounting holes of the multi-connector panel surface; wherein the multi-connector panel assembly includes a bezel member having: (i) a plurality of apertures, and (ii) a rear face having two mounting members; wherein the bezel member is configured to be mounted with respect to the first aperture of the multi-connector panel surface with the two mounting members securing to the two mounting holes; and wherein the fiber optic connector assembly is mounted with respect to at least one aperture of the bezel member.

The present disclosure also provides for a media patching system wherein the fiber optic connector assembly is mounted with respect to a plurality of apertures of the bezel member. The present disclosure also provides for a media patching system wherein the fiber optic connector assembly is a fiber optic cassette.

The present disclosure also provides for a media patching system wherein the second aperture of the multi-connector panel surface is associated with two mounting holes of the multi-connector panel surface; wherein the multi-connector panel assembly includes a bezel member having: (i) a plurality of apertures, and (ii) a rear face having two mounting members; wherein the bezel member is configured to be mounted with respect to the second aperture of the multi-connector panel surface with the two mounting members securing to the two mounting holes; and wherein the copper-based connector assembly is mounted with respect to one aperture of the bezel member.

The present disclosure also provides for a media patching system wherein the first aperture of the multi-connector panel surface is associated with two mounting holes of the multi-connector panel surface; wherein the multi-connector panel assembly includes a bezel member having: (i) a slot, and (ii) a rear face having two mounting members; wherein the bezel member is configured to be mounted with respect to the first aperture of the multi-connector panel surface with the two mounting members securing to the two mounting holes; and wherein the fiber optic connector assembly is mounted with respect to the slot of the bezel member.

The present disclosure also provides for a media patching system wherein the fiber optic connector assembly is a fiber optic cassette having a plurality of fiber optic ports for mating with fiber optic connectors.

The present disclosure also provides for a media patching system including a multi-connector panel assembly having a multi-connector panel surface, the multi-connector panel surface including a plurality of apertures; a fiber optic connector assembly mounted with respect to a first aperture of the plurality of apertures of the multi-connector panel surface; and a copper-based connector assembly mounted with respect to a second aperture of the plurality of apertures of the multi-connector panel surface; wherein the copper-based connector assembly includes a jack housing that is adapted to receive signals from a mating connecting assembly or plug connector; wherein the fiber optic connector assembly includes one or more ports/adapters to facilitate communication with a mating fiber optic connector; wherein the multi-connector panel assembly is mounted with respect to a first frame member and a second frame member; and wherein the first and second frame members are mounted with respect to a tray member and to a door assembly.

The present disclosure also provides for a media patching system wherein the fiber optic connector assembly is mounted with respect to a first plurality of apertures of the plurality of apertures of the multi-connector panel surface; wherein a plurality of copper-based connector assemblies are mounted with respect to a second plurality of apertures of the plurality of apertures of the multi-connector panel surface; and wherein a top cover and a bottom cover are mounted with respect to the first and second frame members.

The present disclosure also provides for a method for fabricating a media patching system including providing a multi-connector panel assembly having a multi-connector panel surface, the multi-connector panel surface including a plurality of apertures; mounting a fiber optic connector assembly with respect to a first aperture of the plurality of apertures of the multi-connector panel surface; and mounting a copper-based connector assembly with respect to a second aperture of the plurality of apertures of the multi-connector panel surface.

Any combination or permutation of embodiments is envisioned. Additional advantageous features, functions and applications of the disclosed systems, methods and assemblies of the present disclosure will be apparent from the description which follows, particularly when read in conjunction with the appended drawings. It is to be understood, however, that the drawings are designed as an illustration only and not as a definition of the limits of the invention. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various steps, features and combinations of steps/features described below and illustrated in the figures can be arranged and organized differently to result in embodiments which are still within the scope of the present disclosure. To assist those of ordinary skill in the art in making and using the disclosed cable management plate assemblies and associated systems and methods, reference is made to the appended figures, wherein.

DESCRIPTION OF EXEMPLARY EMBODIMENTS

Figure 1:
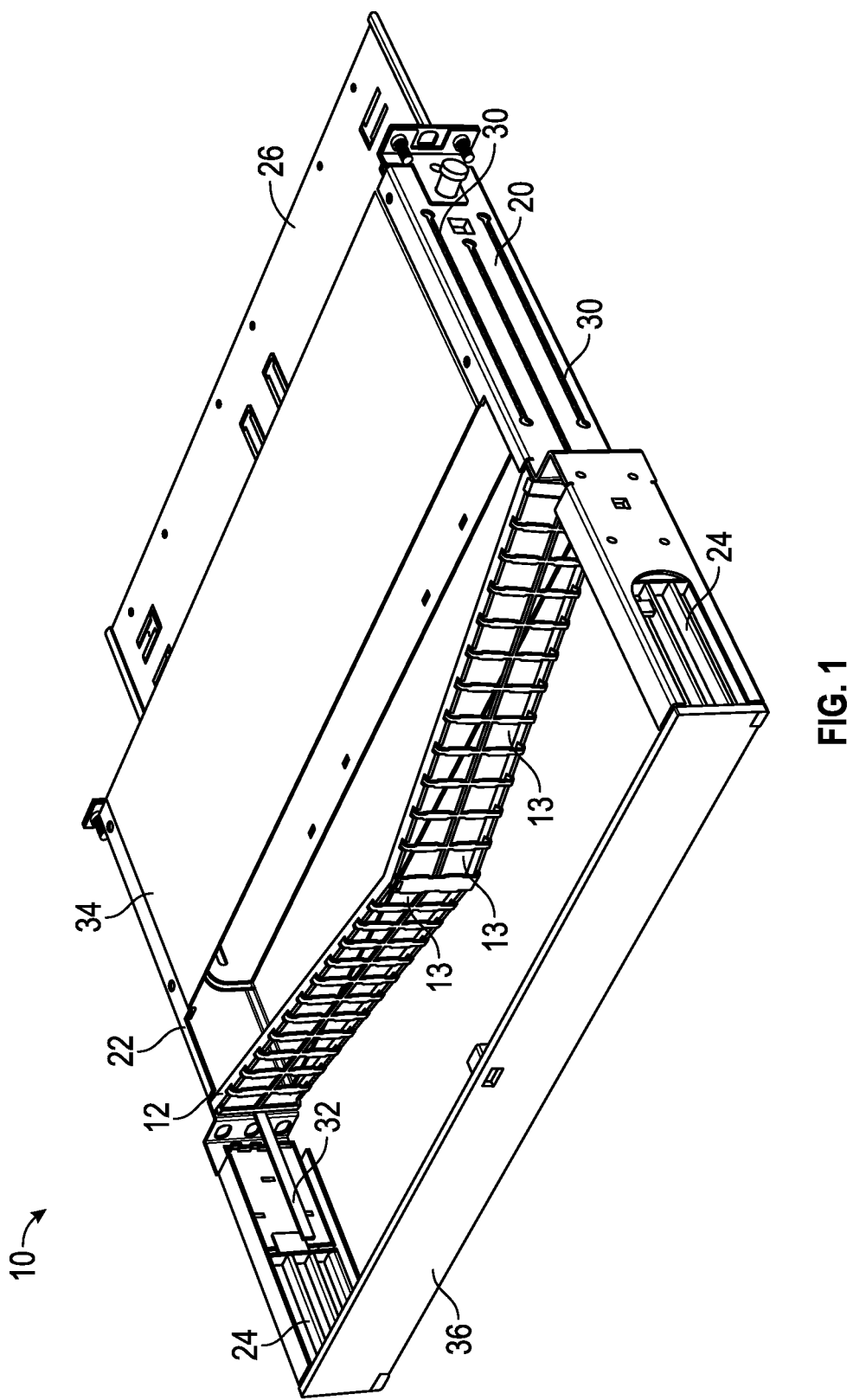
FIG. 1 is a top, perspective view of a media patching system according to an exemplary embodiment of the present disclosure, prior to connector assemblies mounted to the media patching system.
Figure 2:
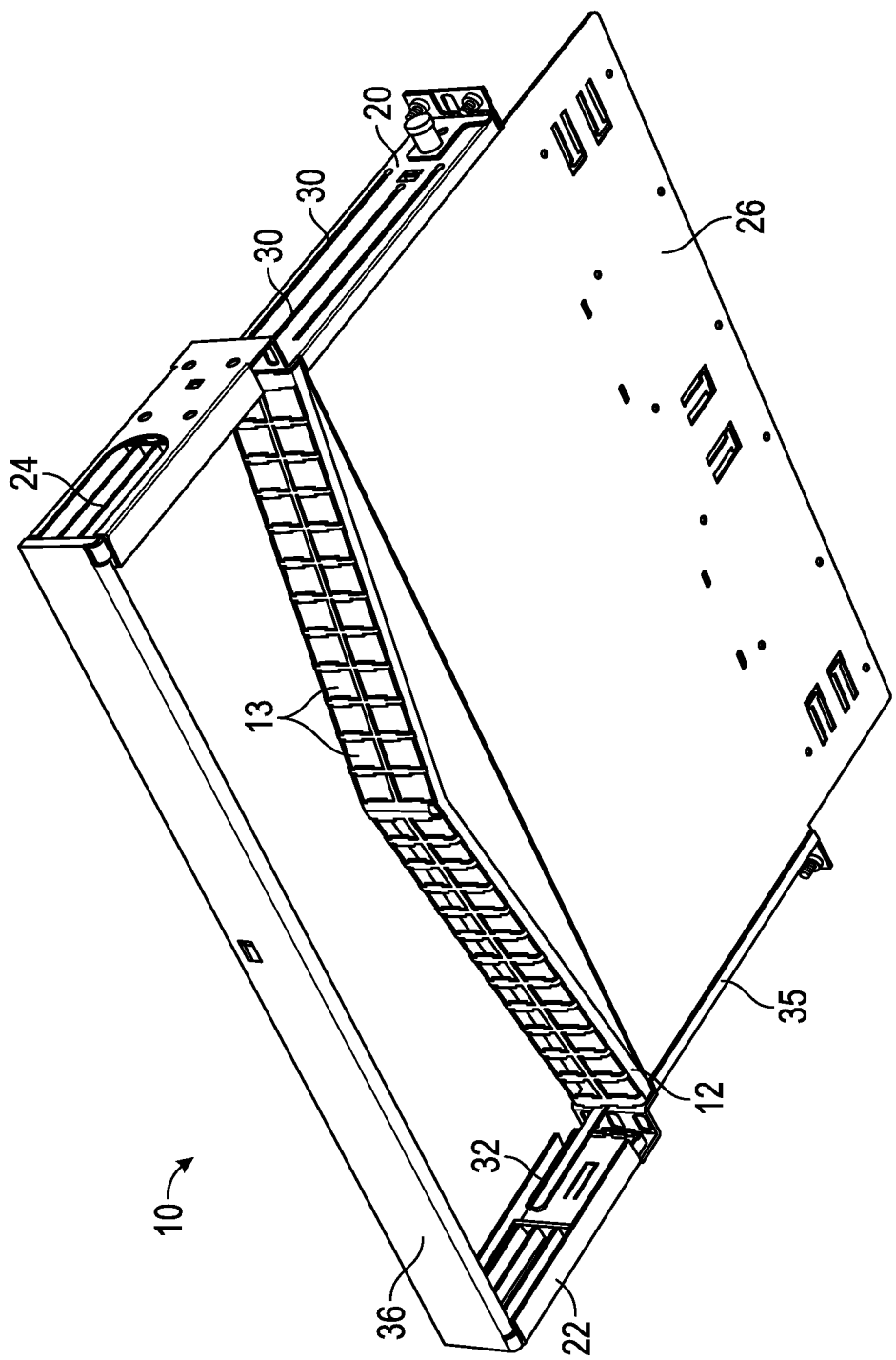
FIG. 2 is a bottom, perspective view of the media patching system of FIG. 1.
Figure 3:
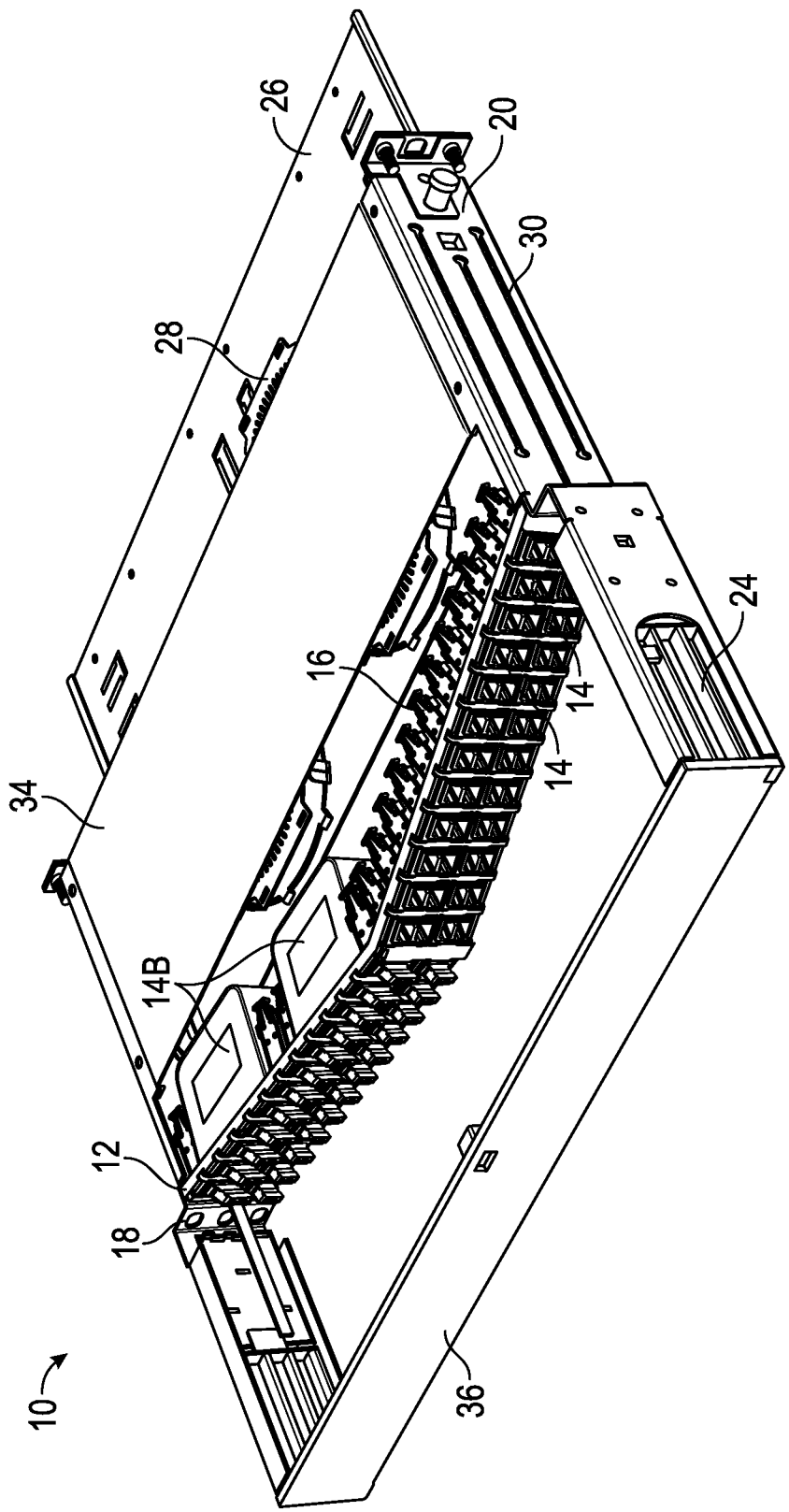
FIG. 3 is a top, perspective view of the media patching system of FIG. 1, after exemplary connector assemblies are mounted to the media patching system.
Figure 4:
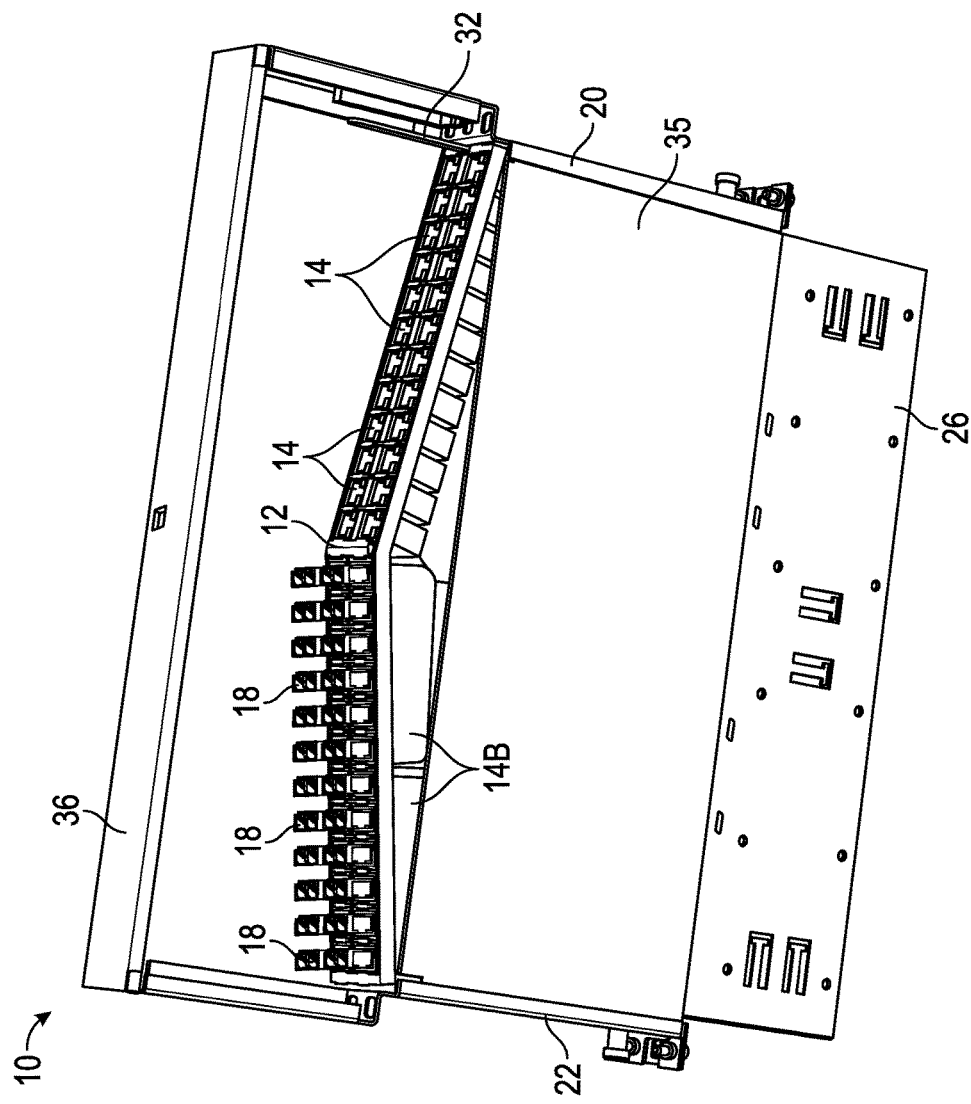
FIG. 4 is a bottom, perspective view of the media patching system of FIG. 3.
Figure 5:
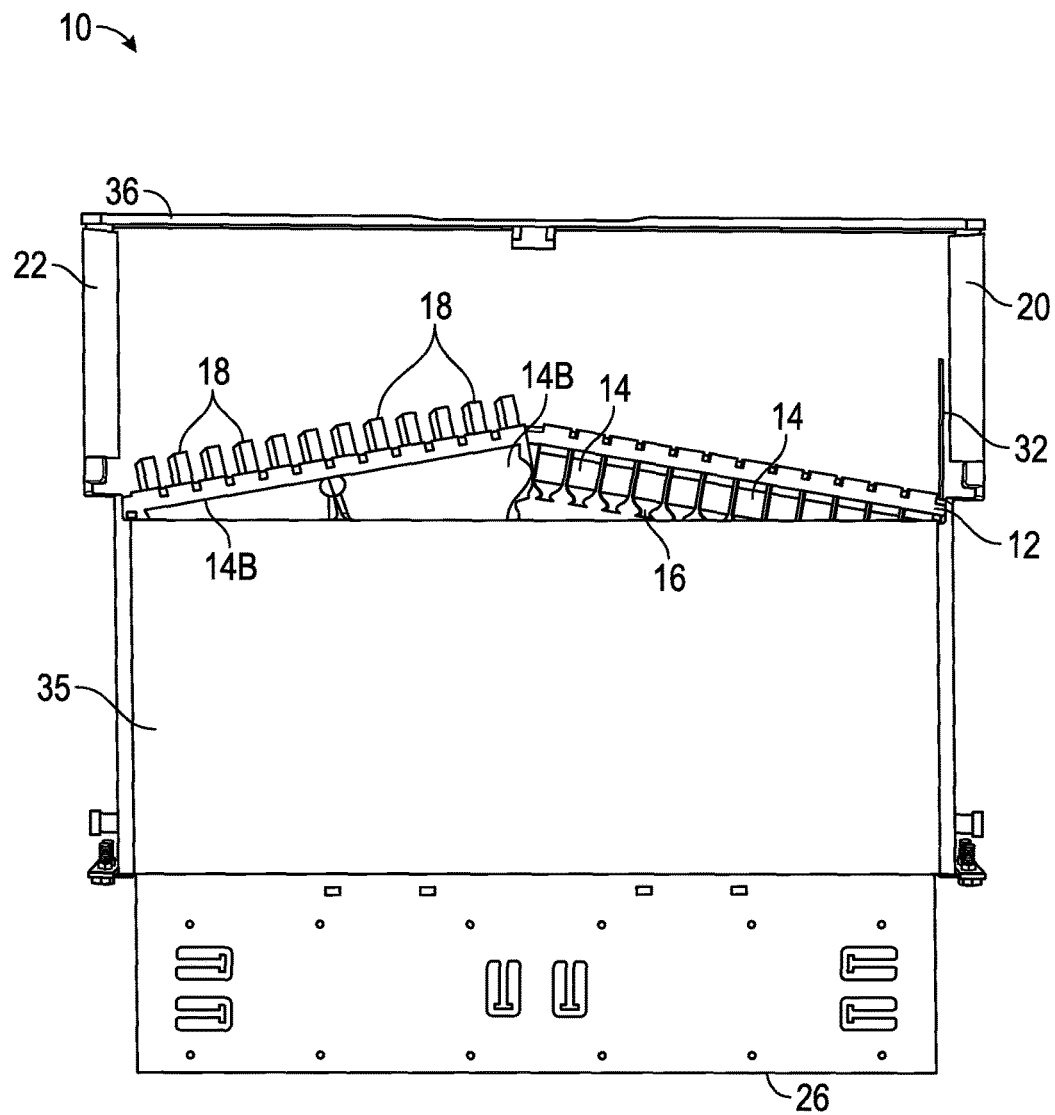
FIG. 5 is a bottom view of the media patching system of FIG. 3.
Figure 6:
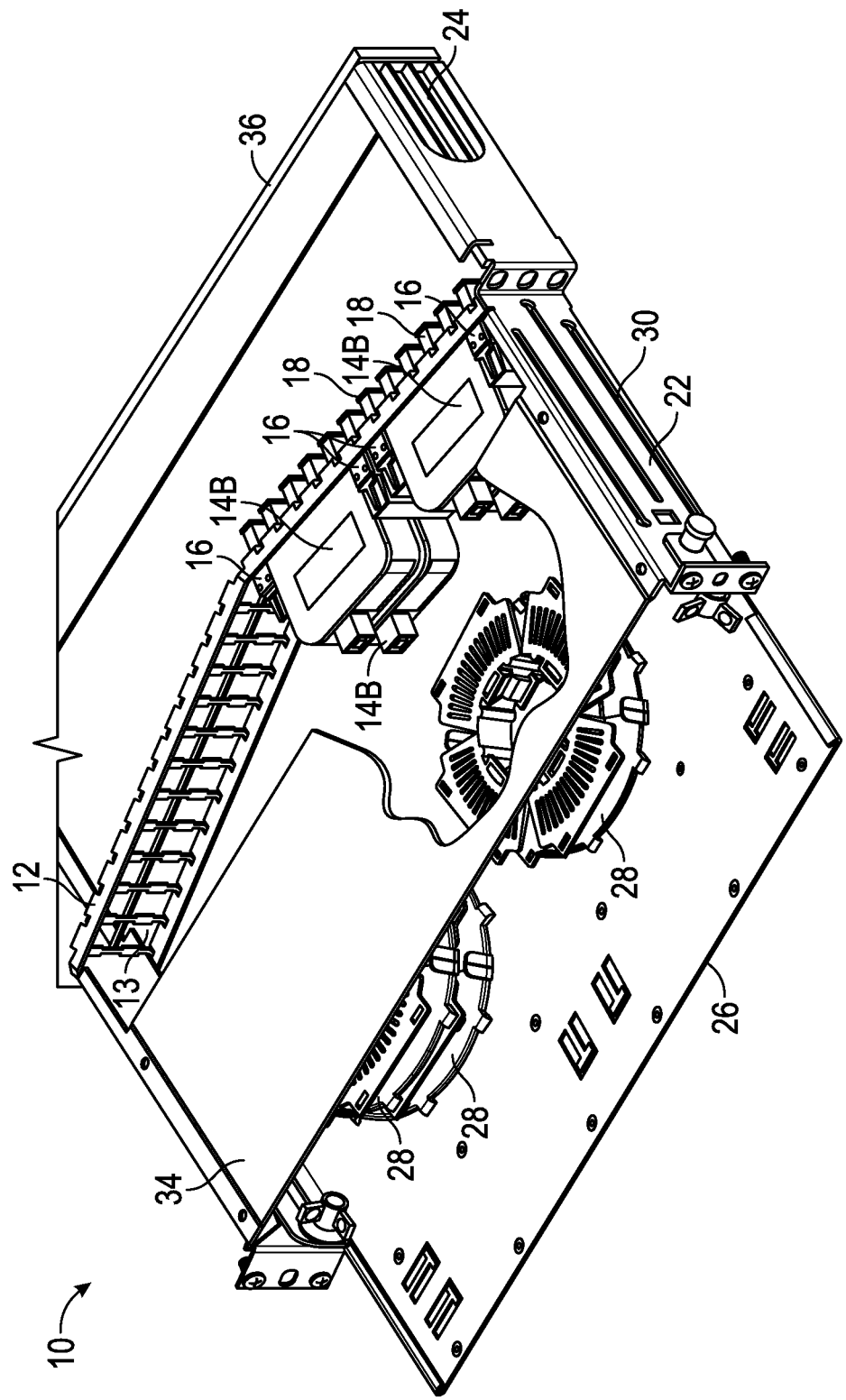
FIG. 6 is a partial top, perspective view of the media patching system of FIG. 1, after exemplary connector assemblies are mounted to the media patching system.

The exemplary embodiments disclosed herein are illustrative of advantageous patch panel assemblies, and patching systems of the present disclosure and methods/techniques thereof. It should be understood, however, that the disclosed embodiments are merely exemplary of the present disclosure, which may be embodied in various forms. Therefore, details disclosed herein with reference to exemplary patch panel assemblies/fabrication methods and associated processes/techniques of assembly and use are not to be interpreted as limiting, but merely as the basis for teaching one skilled in the art how to make and use the advantageous patch panel assemblies/systems and/or alternative assemblies of the present disclosure.

In general, the present disclosure provides improved patch panel assemblies/patching systems, and related methods of use. The present disclosure provides improved systems/methods for the design and use of patch panel assemblies configured to support multiple media connections. More particularly, the present disclosure provides advantageous cable management plates for the design and use of patch panel assemblies configured to organize and support high density connections, and provide convenient access to the supported cables.

In exemplary embodiments, disclosed herein is a high density patching assembly/system configured to support multiple mixed media connections. In some embodiments, the improved systems/assemblies of the present disclosure provide users with the ability to install multiple mixed media connections (e.g., both copper-based and fiber optic connections) in the same patching system/enclosure. For example, in certain embodiments, high density jack patch panels are utilized in the systems/assemblies of the present disclosure to support multiple mixed media connections (e.g., high density, multiple mixed media connections). However, it should be understood that the exemplary cable management plates and patching systems can be used to support one or more types of cables used in a communication network. Moreover, exemplary patch panel assemblies disclosed herein can advantageously increase patching density of the media patching system while maintaining port accessibility.

In exemplary embodiments, the present disclosure provides for improved cable management plates for the organization, support and access of cables used in a patching system which can be secured to a rack and/or a patch panel, thereby providing a significant operational, commercial and/or manufacturing advantage as a result.

Referring now to the drawings, like parts are marked throughout the specification and drawings with the same reference numerals, respectively. Drawing figures are not necessarily to scale and in certain views, parts may have been exaggerated for purposes of clarity.

With reference to FIGS. 1-6, an exemplary media patching system 10 according to the present disclosure is shown. In general, media patching system 10 is configured and dimensioned to be used as a patching system for media connections. More particularly, media patching system 10 can be configured to support high density, multiple media connections, as discussed further below. It is noted that media patching system 10 can take a variety of forms, shapes and/or designs.

In certain embodiments, media patching system 10 provides users with the ability to install multiple media connections (e.g., copper-based connections, fiber optic connections, combinations thereof, or the like) in the same enclosure provided by the media patching system 10. In some embodiments and as discussed further below, high density jack patch panel assemblies 12 (multi-connector panel assemblies 12) can be utilized with media patching system 10 to support multiple media connections (e.g., high density, multiple media connections, such as copper connections, fiber optic connections, combinations thereof, or the like). Exemplary patch panel assemblies/multi-connector panel assemblies 12 disclosed herein advantageously increase the patching density of system 10.

Figure 11:
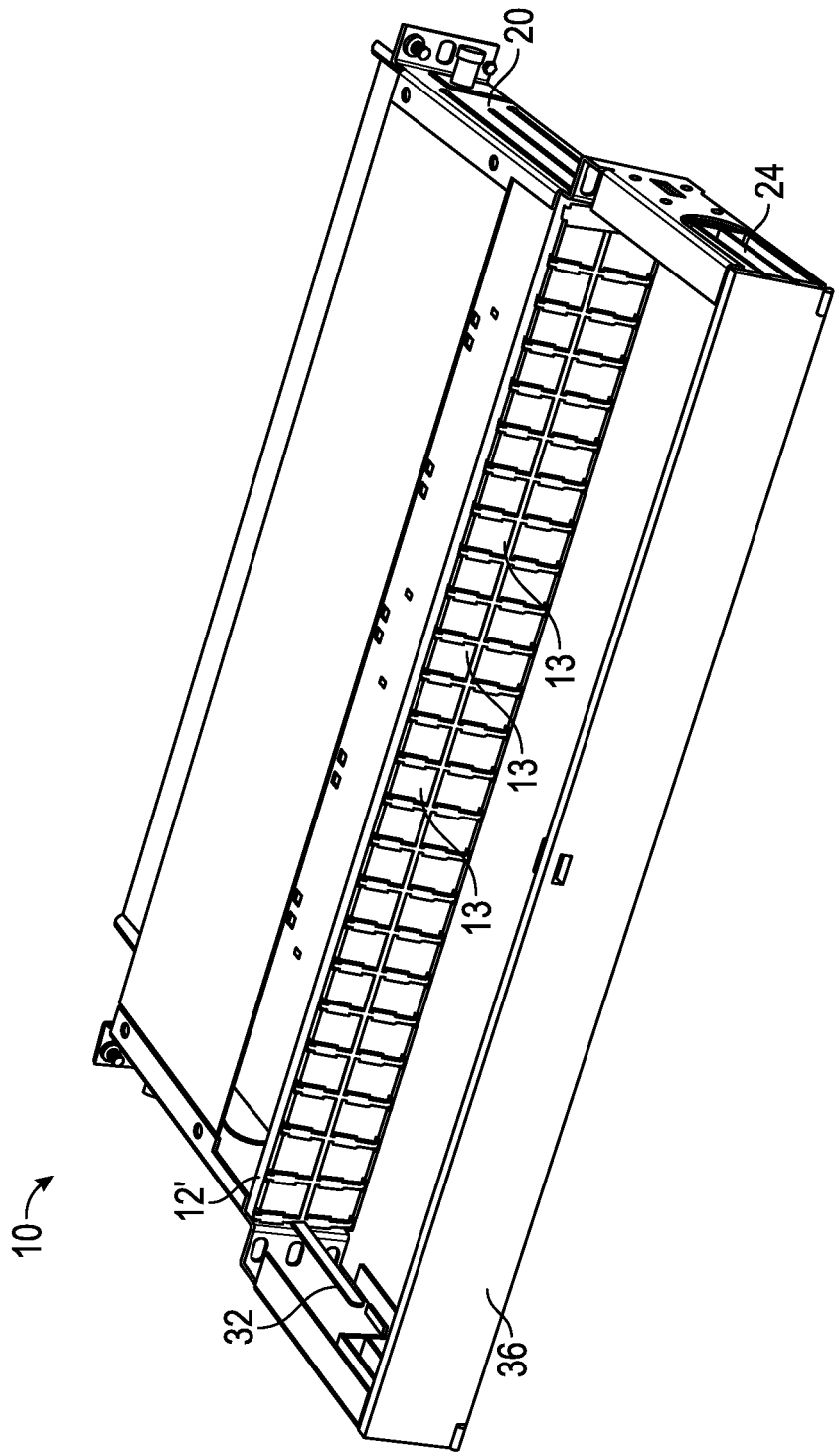
FIG. 11 is a top, perspective view of another exemplary media patching system of the present disclosure, prior to connector assemblies mounted to the media patching system.
Figure 12:
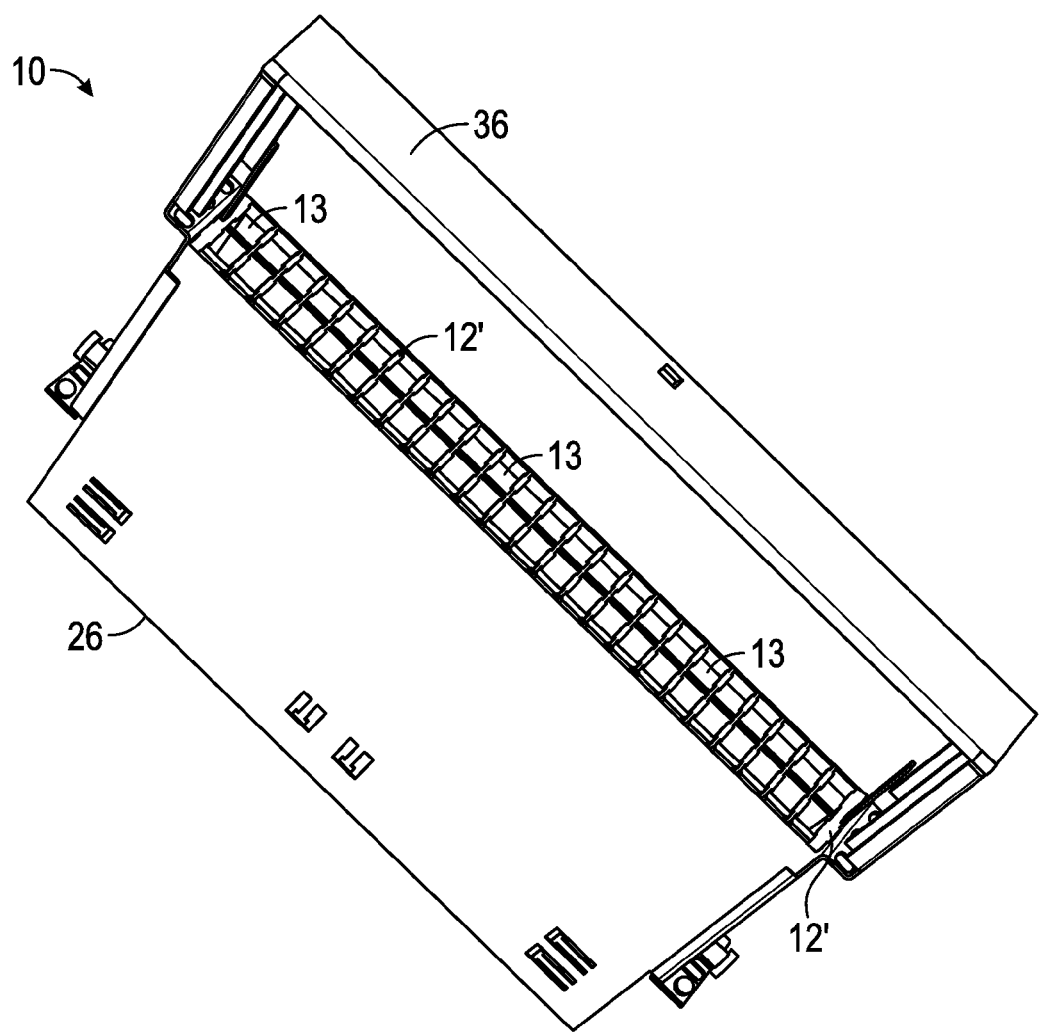
FIG. 12 is a bottom, perspective view of the media patching system of FIG. 11.

In general, media patching system 10 includes a patch panel assembly/multi-connector panel assembly 12. Exemplary multi-connector panel assembly 12 has a panel surface that includes a plurality of apertures 13. As discussed in further detail below, each aperture 13 is typically configured and dimensioned to have a connector assembly/connective device 14, 14A or 14B mounted with respect thereto (FIGS. 3-6, 13, 16, 21 and 26). It is noted that the panel surface of multi-connector panel assembly 12 can be angled (FIGS. 1-6), or it can be substantially flat or planar (assembly 12' of FIGS. 11-13). Additionally, it is further noted that assembly 12, 12' can take a variety of shapes, forms and/or geometries.

As shown in FIGS. 1 and 3-5, one or more connector assemblies 14 can be mounted with respect to panel assembly 12 (e.g., with one aperture 13 configured to house/mount to one assembly 14), as described and disclosed in U.S. Pat. Nos. 8,439,702 and 8,672,709 noted above. More particularly, each connector assembly 14 typically includes a movable locking member 16 (FIGS. 3, 6 and 21) that is configured to releasably secure the connector assembly 14 to panel assembly 12 as described and disclosed in U.S. Pat. Nos. 8,439,702 and 8,672,709. Panel assembly 12 can include any number of connector assemblies 14 mounted thereon (e.g., one, two, three, four, a plurality, etc.).

Each exemplary connector assembly 14 takes the form of a copper-based electrical connector assembly 14. More particularly, it is noted that each connector assembly 14 includes a jack housing (e.g., high density modular communication jack housing) that is adapted to receive signals from a mating connecting assembly (e.g., a plug connector, such as an RJ-45 plug or an IEC 60603-7-7 compliant plug) inserted or introduced to a receiving space of the jack housing. As such, associated contacts (e.g., eight contacts) or the like of the jack housing are positioned for electrical communication with data signal transmission media plug elements/contacts introduced to the receiving space of the jack housing. In general, the jack housing of electrical connector assembly 14 is suitable for use in various applications, e.g., for interfacing with high frequency data transfer media, connection to data transfer devices or the like, etc. For example, the jack housing of connector assembly 14 may be mounted to a printed circuit board (PCB) and signals may transfer from a plug connector introduced to the receiving space of connector assembly 14 to the PCB and then to insulation displacement contacts (IDCs), thus completing the data interface and transfer through connector assembly 14.

Figure 13:
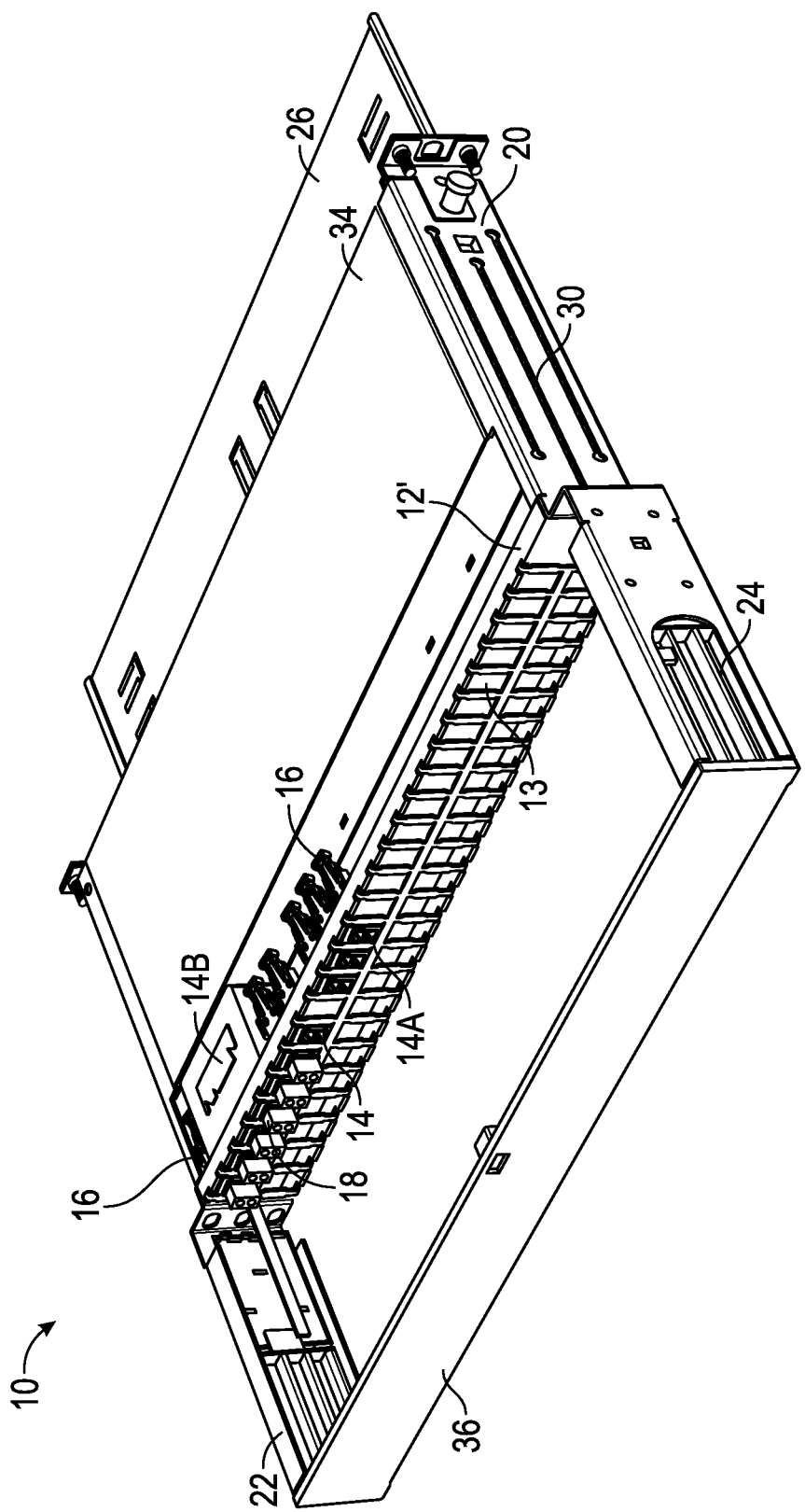
FIG. 13 is a top, perspective view of the medial patching system of FIG. 11, after exemplary connector assemblies are mounted to the media patching system.
Figure 21:
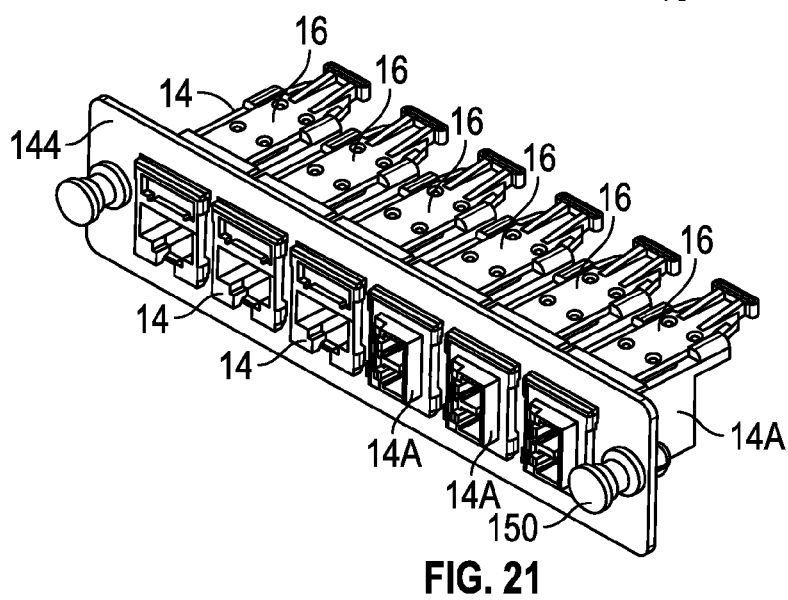
FIG. 21 is a front, perspective view of the bezel member of FIG. 17, after exemplary connector assemblies are mounted to the bezel member.

In some embodiments and as discussed below in connection with FIGS. 13 and 21, panel assembly 12 can have one or more connector assemblies 14A mounted thereon (via apertures 13). Each connector assembly 14A takes the form of a fiber optic connector assembly 14A. Panel assembly 12 can include any number of connector assemblies 14A mounted thereon (e.g., one, two, three, four, a plurality, etc.).

More particularly, each connector assembly 14A includes one or more ports/adapters to facilitate communication with a mating assembly (e.g., fiber optic connector), that in turn can interact with various fiber optic media (fiber optic cables, etc.). The ports/adapters of assembly 14A are typically positioned for communication with fiber optic connectors introduced to a receiving space of the assembly 14A. Similar to connector assembly 14, each connector assembly 14A typically includes a movable locking member 16 (FIGS. 13 and 21) that is configured to releasably secure the connector assembly 14A to panel assembly 12, as described above.

As shown in FIGS. 3-6, one or more connector assemblies 14B can be mounted with respect to panel assembly 12. Panel assembly 12 can include any number of connector assemblies 14B mounted thereon. Exemplary connector assembly 14B takes the form of a fiber optic cassette 14B having a plurality of fiber optic ports/adapters (e.g., 12 ports) for mating with fiber optic connectors. In certain embodiments, connector assembly 14B includes six port housings 18, with each port housing 18 including two or more fiber optic ports/adapters (e.g., LC, SC, MPO adapters).

Figure 22:
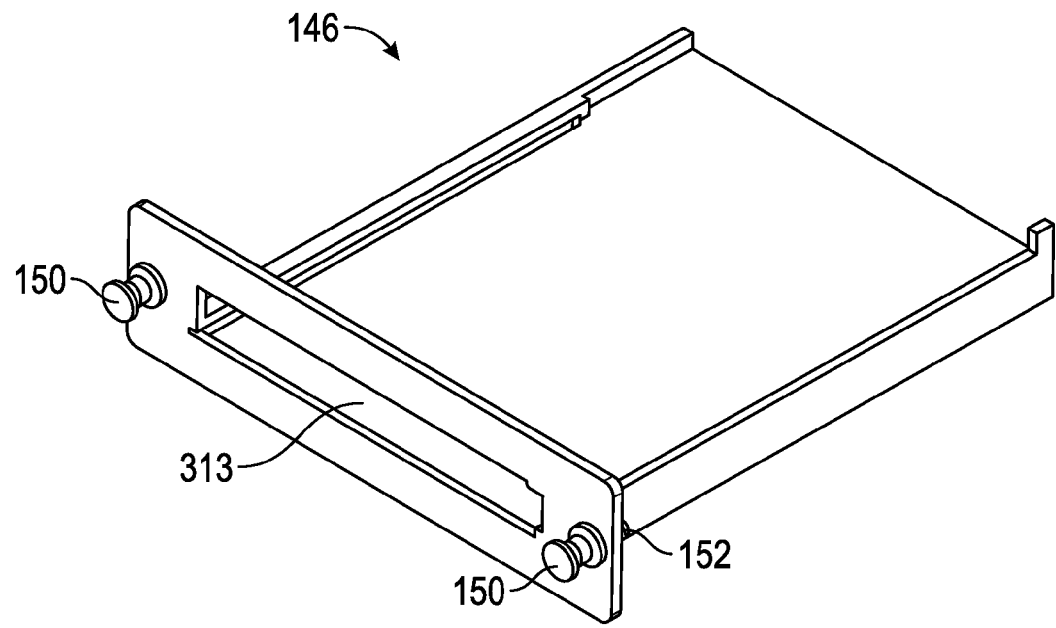
FIG. 22 is a front perspective view of another exemplary bezel member for use with the media patching system of FIG. 14.

Each port housing 18 is configured to be inserted through and mounted with respect to six respective apertures 13 of panel assembly 12 via locking members 16 disposed on each top end of connector assembly 14B (FIGS. 3 and 22), as similarly discussed above for locking members 16 of assemblies 14 and 14A. It is noted that connector assembly 14B can include any suitable number of port housings 18 and/or fiber optic ports and/or locking members 16 for mounting to panel assembly 12, and/or for fiber optic communication purposes.

Figure 26:
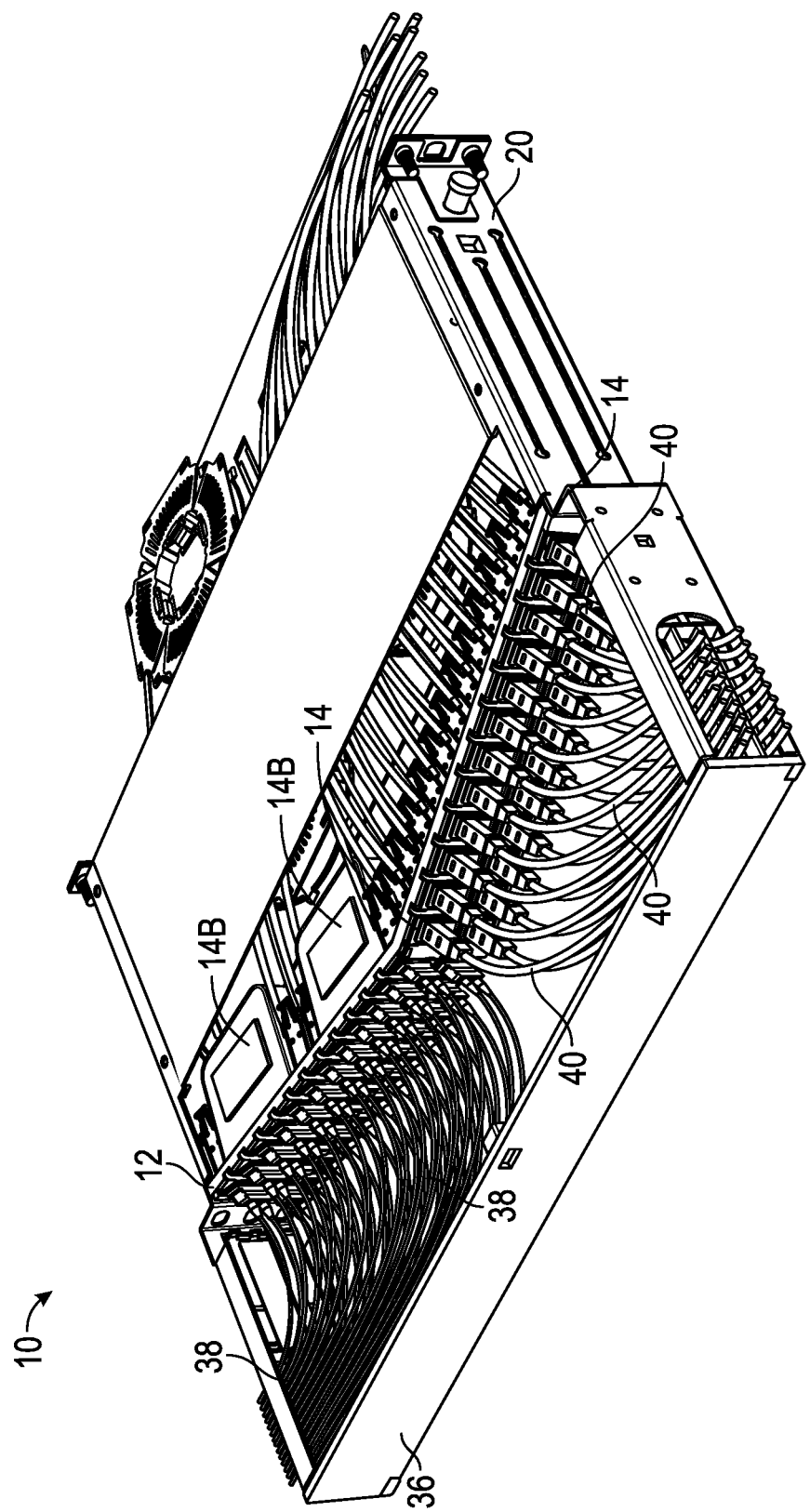
FIG. 26 is a top, perspective view of the media patching system of FIG. 3, after exemplary cables/wires are mounted to the media patching system.

It is noted that panel assembly 12 of media patching system 10 can include any number, combination and/or permutation of connector assemblies/connector devices 14, 14A and/or 14B. As such, panel assembly 12 can include connector assemblies 14, 14A or 14B, or mixtures thereof. Thus, panel assembly 12 of media patching system 10 advantageously provides users with the ability to install multiple mixed media connections (e.g., both copper-based 14, and fiber optic connections 14A, 14B) in the same media patching system 10. Moreover, panel assembly 12 can advantageously increase patching density of the media patching system 10 while maintaining port accessibility. FIG. 26 shows a plurality of cables 38 mounted with respect to the ports of connector assemblies 14B, and a plurality of cables 40 mounted with respect to the jack housings of connector assemblies 14.

Figure 27:
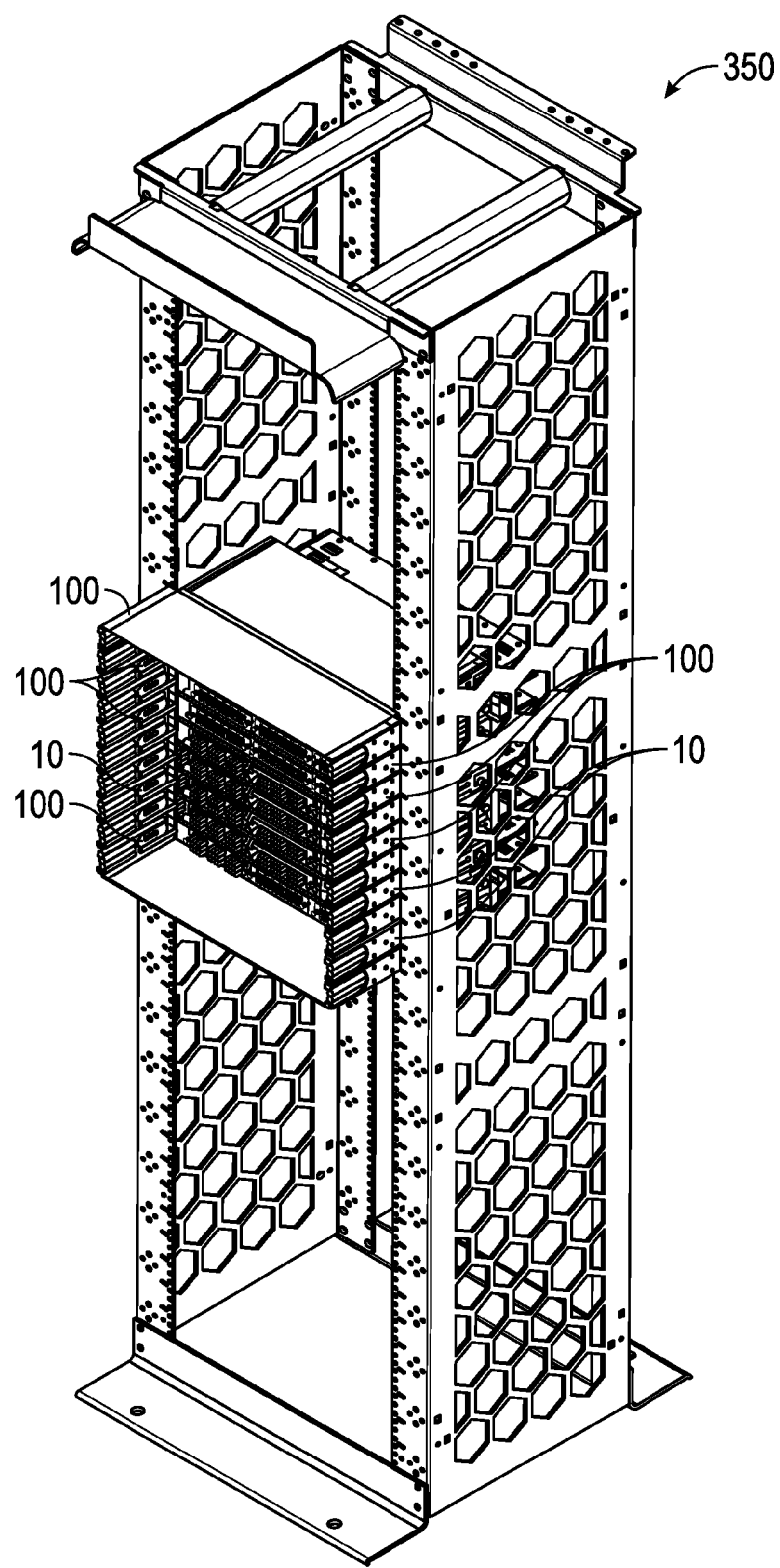
FIG. 27 is a side, perspective view of exemplary media patching systems mounted with respect to a supporting structure.

In some embodiments, media patching system 10 can be configured and dimensioned to be mounted with respect to a supporting structure (e.g., rack 350—FIG. 27) or the like. As shown in FIG. 27, it is noted that exemplary media patching systems 10 (and 100) are adapted for use in conjunction with a rack 350 (e.g., network or server rack) or the like, although the present disclosure is not limited thereto. Rather, the disclosed media patching systems 10 and/or 100 are adapted for use in conjunction with other structures, such as, for example, frames, walls, cabinets, supporting structures, or other structures that stand to benefit from proximate cable management functionality. For ease of disclosure, the potential structures to which the disclosed systems 10/100 may be mounted are collective referred to as "rack(s)." However, it is to be understood that the present disclosure is not limited by or to implementations wherein the disclosed systems 10/100 are mounted with respect to, or used in conjunction with, a rack, but may be mounted with respect to, or used in conjunction with other structures/units (e.g., structures/units associated with cable routing).

As shown in FIG. 27, one or more media patching systems 10 and/or 100 can be mounted with respect to rack 350 or the like. Any suitable number of systems 10/100 can be mounted with respect to rack 350, and the systems 10/100 may or may not include cover members 33, 34 and/or 35. For example and as shown in FIG. 27, ten media patching systems 10/100 are mounted with respect to rack 350, with the ten systems mounted proximal to one another within rack 350. In one embodiment, the top system 100 in rack 350 includes top cover members 33 and 34, and the bottom system 100 includes lower cable management plate 35.

Exemplary rack 350 is depicted in FIG. 27, and such rack 350 and other exemplary mounting structures suitable for use with systems 10/100 are described and disclosed in U.S. Pat. No. 7,983,038, the entire contents of which is hereby incorporated by reference in its entirety. However and as noted above, systems 10/100 may be mounted with respect to or used in conjunction with other structures/units.

Figure 9:
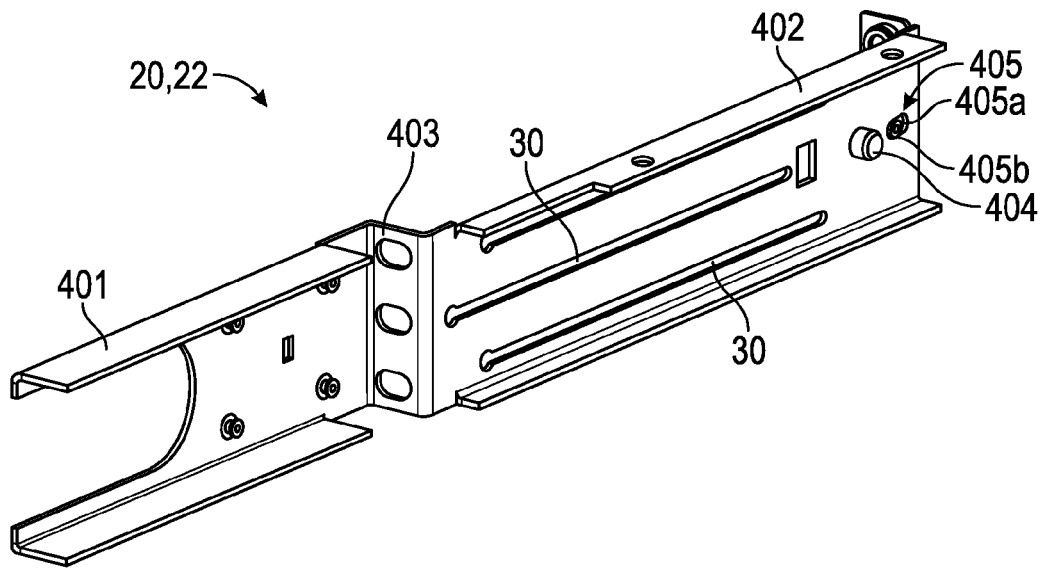
FIG. 9 is a side, perspective view of an exemplary frame member of the media patching system of FIG. 1.
Figure 10:
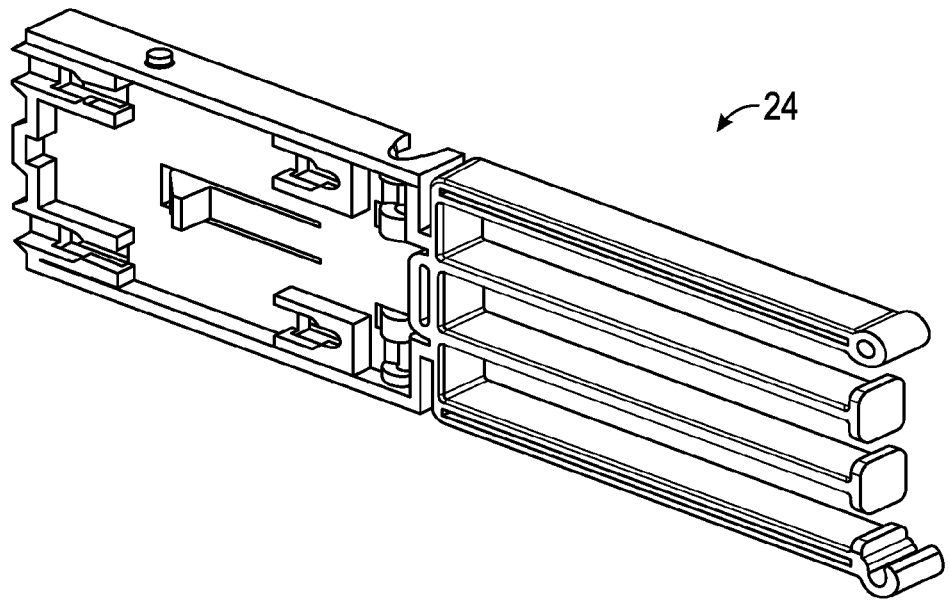
FIG. 10 is a side, perspective view of an exemplary cable management member of the media patching system of FIG. 1.

Multi-connector panel assembly 12 of media patching system 10 can be mounted with respect to a first frame member 20 and a second frame member 22 (FIGS. 1 and 9). A cable management member 24 can be mounted with respect to each frame member 20, 22 for cable/wire management purposes of media patching system 10. Each frame member 20, 22 can be mounted with respect to an upper cable management plate 26, which will be discussed in greater detail below. Upper cable management plate 26 can include one or more cable management spools 28 or the like removably mounted thereon for cable/wire management purposes of system 10. System 10 may or may not include top covers 33, 34 and/or lower cable management plate 35 (e.g., mounted with respect to frame members 20, 22). System 10 may also include a door assembly 36 (e.g., mounted with respect to frame members 20, 22) that is configured to open, close, lock and unlock as desired by a user.

Figure 7:
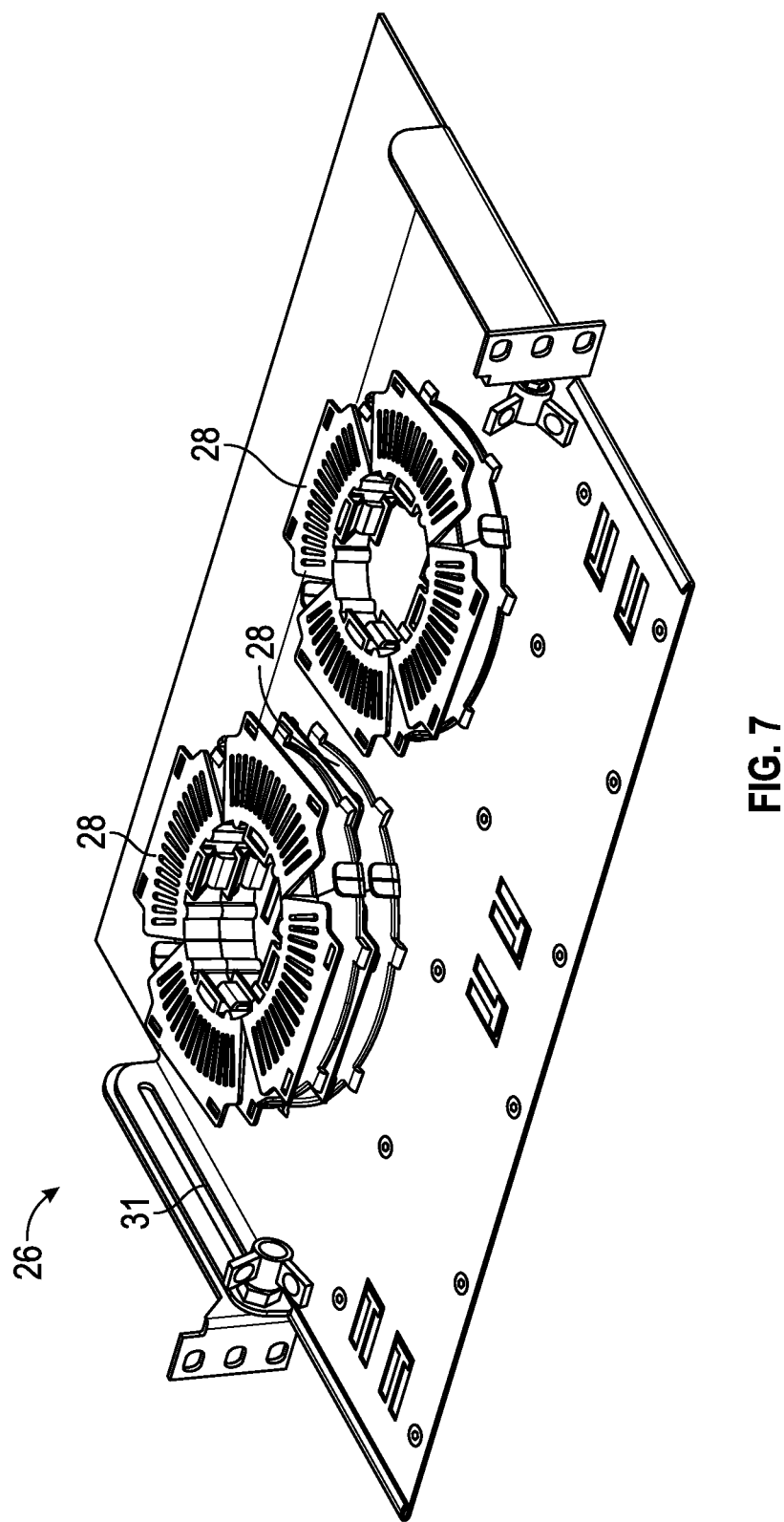
FIG. 7 is a top, perspective view of an exemplary cable management plate assembly including upper cable management plate and lower cable management plate of the media patching system of FIG. 1.
Figure 8:
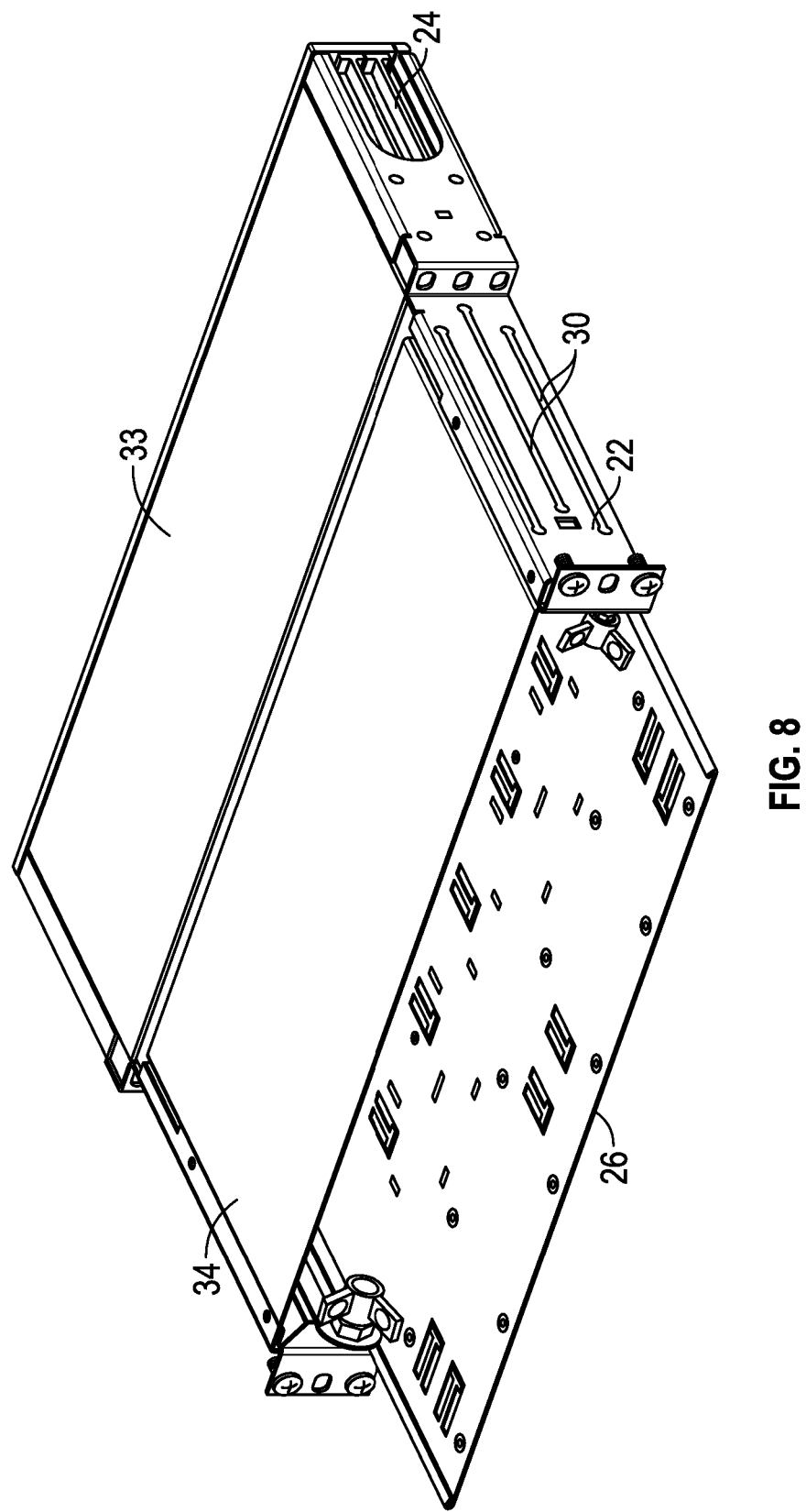
FIG. 8 is a top, perspective view of the media patching system of FIG. 1, with an exemplary front cover member attached.

In some embodiments, panel assembly 12 can be movably mounted relative to frame members 20, 22 via one or more slots 30 of frame members 20, 22. Pull tab members 32 of panel assembly 12 can facilitate movement of panel assembly 12 relative to frame members 20, 22. Upper cable management plate 26 can move relative to frame members 20, 22 via slots 31 of upper cable management plate 26 (FIG. 7). In some embodiments, movement or sliding of the upper cable management plate 26 relative to frame members 20, 22 can be independent from movement of panel assembly 12. Upper cable management plate 26 can therefore be extended from the media patching system 10 without affecting the position of panel assembly 12.

As noted above and as shown in FIGS. 11-13, media patching system 10 can include a panel assembly 12' having a panel surface that is substantially flat or planar. Similar to panel assembly 12, the flat/planar panel assembly 12' can include any number, combination and/or permutation of connector assemblies/connector devices 14, 14A and/or 14B. As such, panel assembly 12' can include connector assemblies 14, 14A or 14B, or mixtures thereof. Thus, panel assembly 12' of system 10 advantageously provides users with the ability to install multiple media connections (e.g., copper-based connections 14, fiber optic connections 14A, 14B, combinations thereof, or the like) in the same media patching system 10. Moreover, panel assembly 12' can advantageously increase patching density of the media patching system 10 while maintaining port accessibility.

Figure 14:
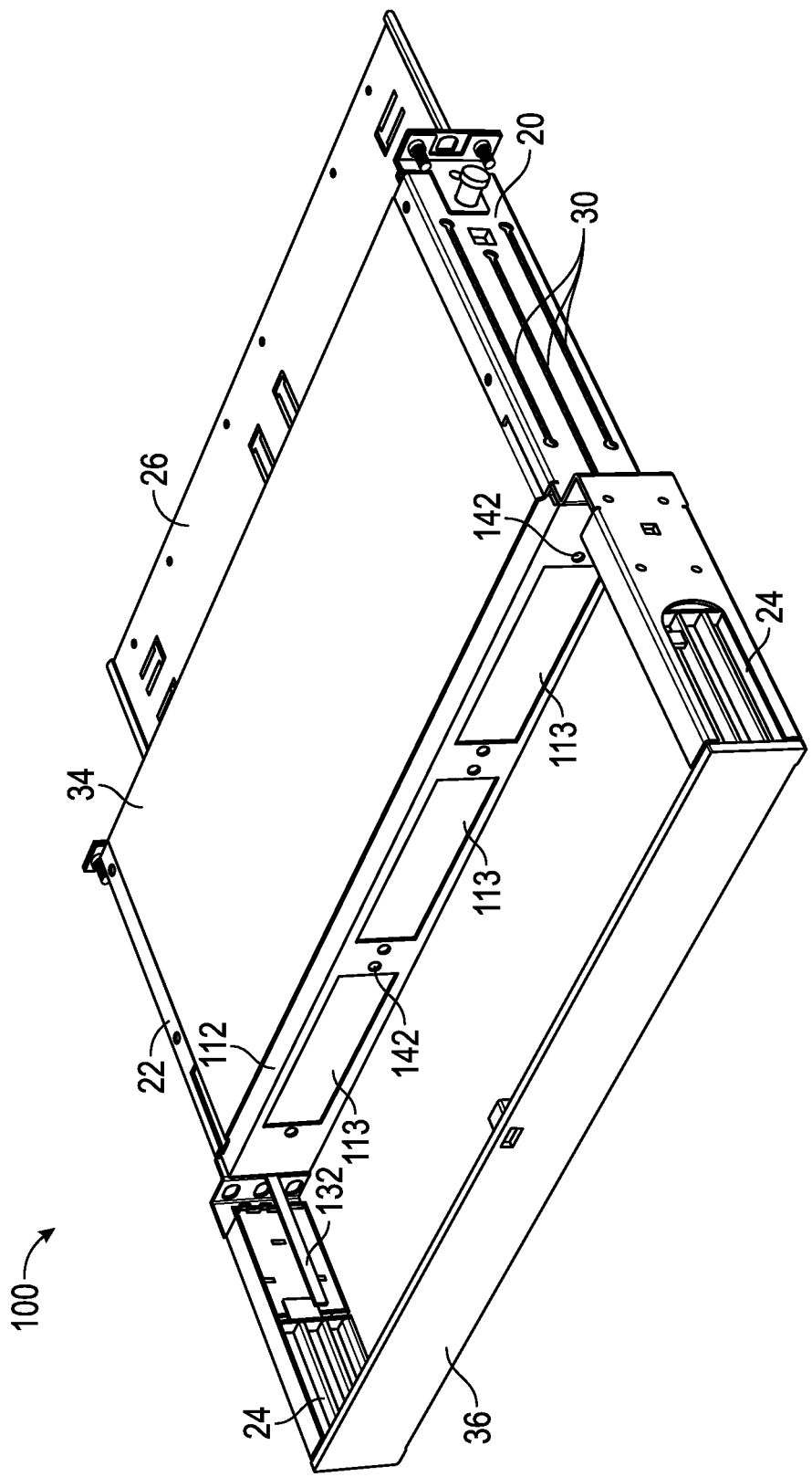
FIG. 14 is a top, perspective view of another exemplary media patching system of the present disclosure, prior to connector assemblies mounted to the medial patching system.
Figure 15:
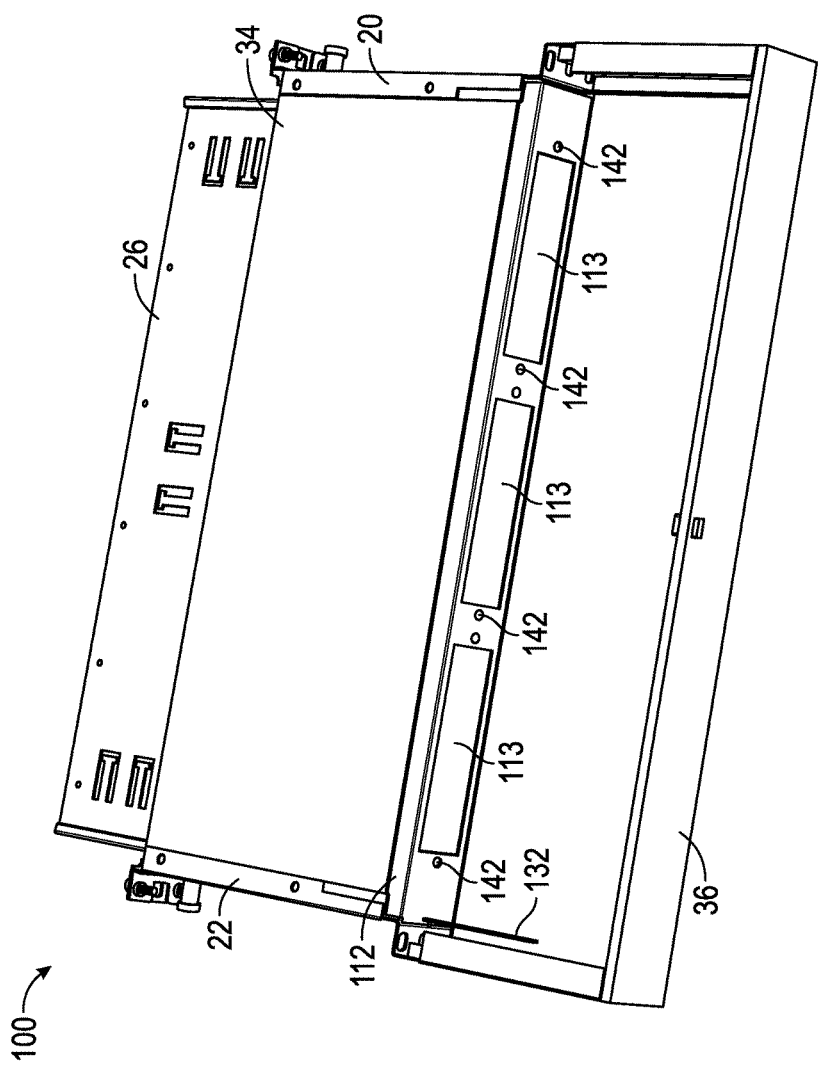
FIG. 15 is a top, perspective view of the media patching system of FIG. 14.
Figure 16:
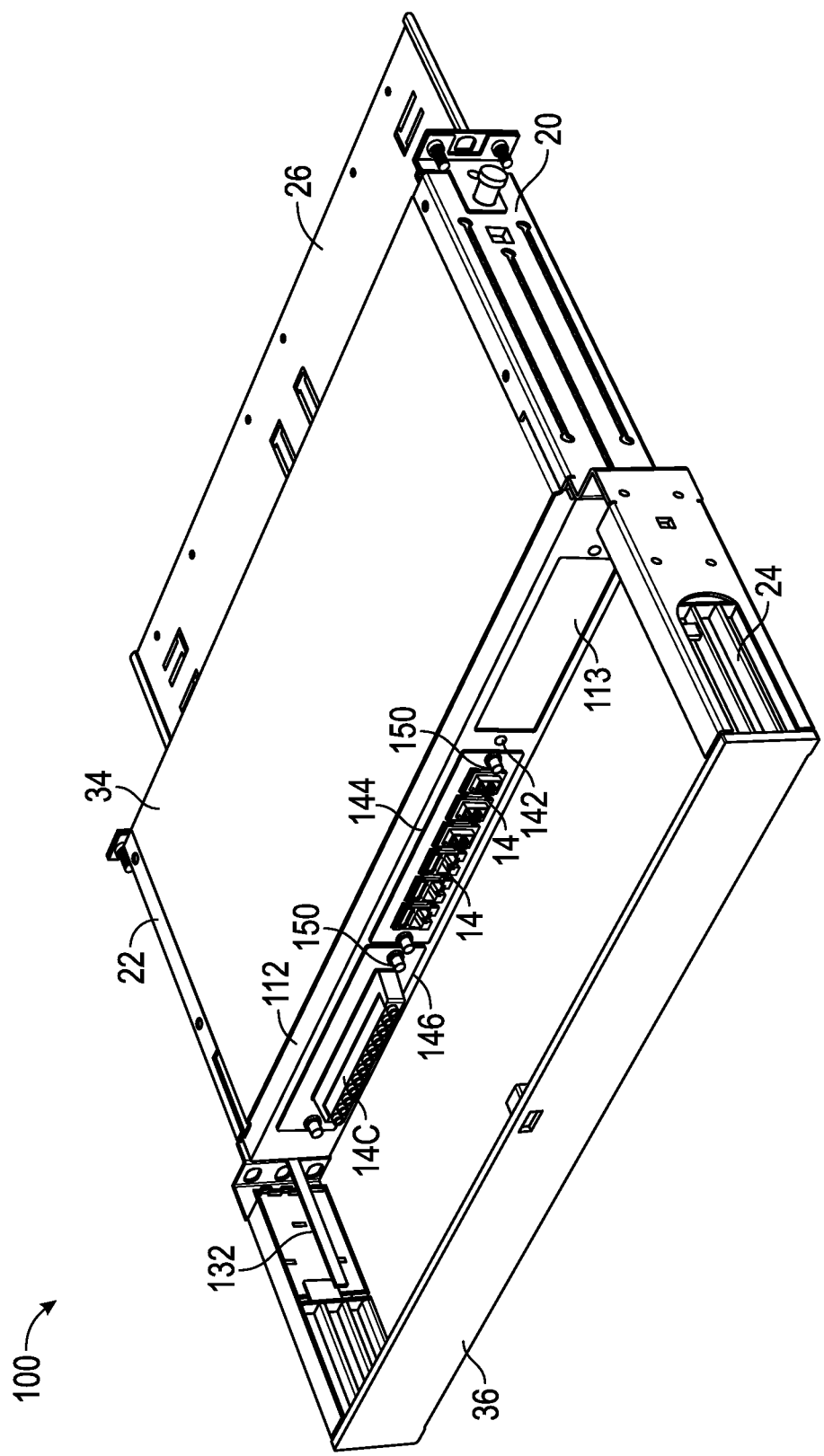
FIG. 16 is a top, perspective view of the media patching system of FIG. 14, after exemplary connector assemblies are mounted to the media patching system.
Figure 17:
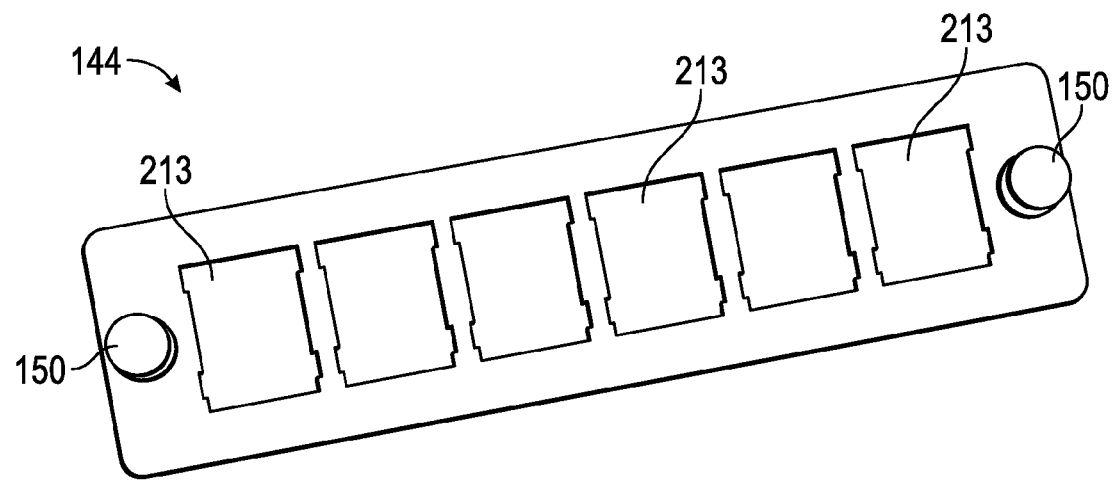
FIG. 17 is a front view of an exemplary bezel member for use with the media patching system of FIG. 14.
Figure 18:
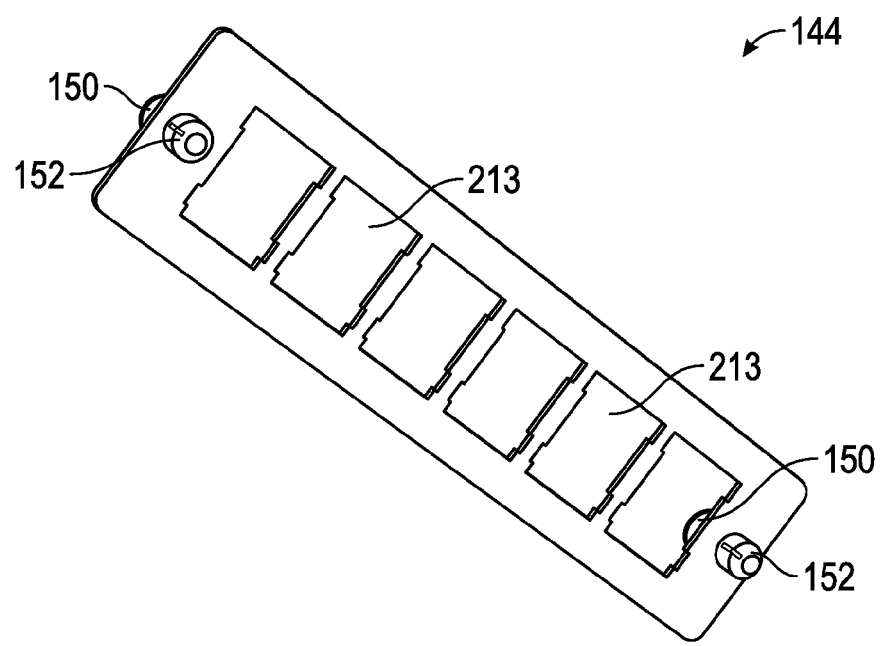
FIG. 18 is a rear, perspective view of the bezel member of FIG. 17.
Figure 19:
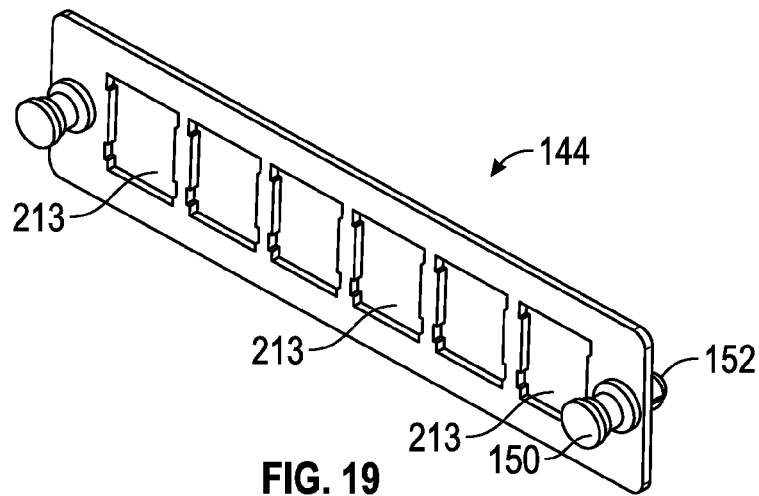
FIG. 19 is a front, perspective view of the bezel member of FIG. 17.
Figure 20:
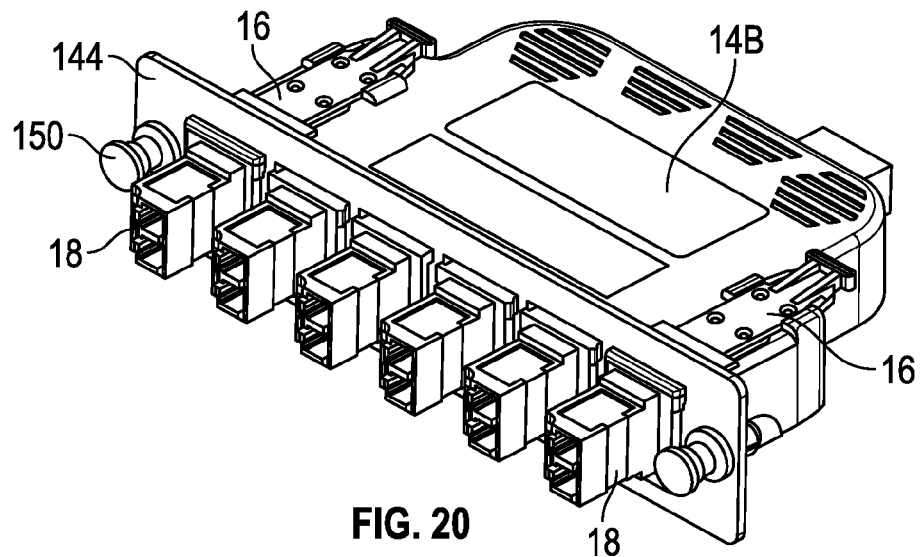
FIG. 20 is a front, perspective view of the bezel member of FIG. 17, after an exemplary connector assembly is mounted to the bezel member.

In some embodiments and as shown in FIGS. 14-16, exemplary media patching system 100 is similar to system 10 discussed above, except for the distinctions noted herein. Similar to system 10 discussed above, media patching system 100 is configured and dimensioned to be used as a patching system for multiple media connections. More particularly, media patching system 100 can be configured to support high density, multiple media connections. It is noted that media patching system 100 can take a variety of forms, shapes and/or designs.

In exemplary embodiments, system 100 is a high density patching system configured to support multiple mixed media connections. In certain embodiments, system 100 provides users with the ability to install multiple media connections (e.g., copper-based connections, fiber optic connections, combinations thereof, or the like) in the same media patching system 100.

Similar to system 10 above, media patching system 100 includes a patch panel assembly or multi-connector panel assembly 112. In certain embodiments, media patching system 100 is configured and dimensioned to be mounted with respect to a supporting structure (e.g., rack 350—FIG. 27) or the like. As shown in FIG. 27, it is noted that exemplary media patching systems 100 (and 10) are adapted for use in conjunction with a rack 350 (e.g., network or server rack) or the like. As shown in FIG. 27, one or more media patching systems 100 (and/or 10) can be removably mounted with respect to rack 350 or the like.

Multi-connector panel assembly 112 of media patching system 100 can be mounted with respect to a first frame member 20 and a second frame member 22 (FIGS. 9 and 14-16). A cable management member 24 can be mounted with respect to each frame member 20, 22 for cable/wire management purposes of system 100. Each frame member 20, 22 can be mounted with respect to an upper cable management plate 26, which will be discussed in greater detail below. Upper cable management plate 26 can include one or more cable management spools 28 or the like removably mounted thereon for cable/wire management purposes. System 100 may or may not include top covers 33, 34 and/or bottom cover 35 (e.g., mounted with respect to frame members 20, 22). System 100 may also include a door assembly 36 (e.g., mounted with respect to frame members 20, 22) that is configured to open, close, lock and unlock as desired by a user.

In some embodiments, panel assembly 112 can be movably mounted relative to frame members 20, 22 via one or more slots 30 of frame members 20, 22. Pull tab members 132 of panel assembly 112 can facilitate movement of panel assembly 112 relative to frame members 20, 22. Upper cable management plate 26 can move relative to frame members 20, 22 via slots 31 of upper cable management plate 26 (FIG. 7).

Exemplary multi-connector panel assembly 112 has a panel surface that includes a plurality of apertures 113. As shown in FIGS. 14-25 and as discussed in further detail below, each aperture 113 is typically configured and dimensioned to have a connector assembly/connective device 14, 14A, 14B, 14C or 14D mounted with respect thereto (e.g., via bezel member 144, 146 or 148). As discussed further below, each aperture 113 of panel assembly 112 is typically associated with one or more mounting holes 142 of panel assembly 12.

It is noted that the panel surface of multi-connector panel assembly 112 can be substantially flat or planar (FIGS. 14-16), or it can be can be angled. Additionally, it is further noted that assembly 112 can take a variety of shapes, forms and/or geometries.

In exemplary embodiments and as shown in FIGS. 16-25, panel assembly 112 can include one or more bezel members 144, 146 and/or 148. Bezel member 144 can include one or more apertures 213, with each aperture 213 configured and dimensioned to have a connector assembly/connective device 14, 14A, 14B mounted with respect thereto, as similarly discussed above in connection with apertures 13 of panel assembly 12 (e.g., via moving locking members 16 of connector assembly/connective device 14, 14A, 14B).

Figure 23:
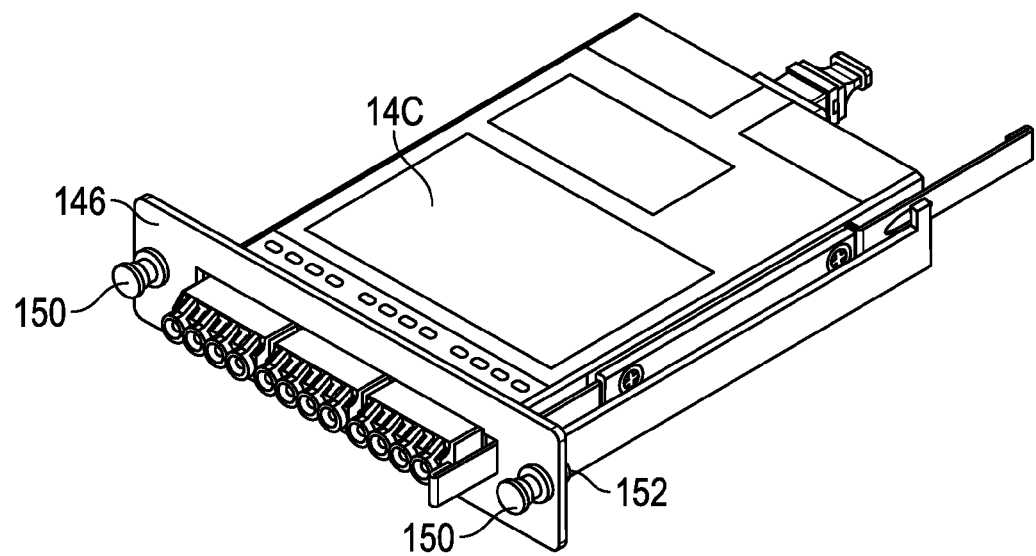
FIG. 23 is a front, perspective view of the bezel member of FIG. 22, after an exemplary connector assembly is mounted to the bezel member.
Figure 24:
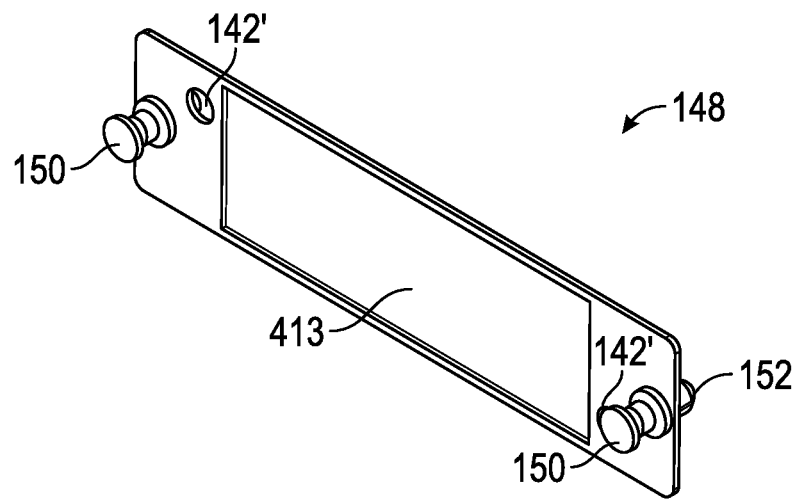
FIG. 24 is a front, perspective view of another exemplary bezel member for use with the media patching system of FIG. 14.

In exemplary embodiments, the front face of bezel member 144 includes one or more handle members 150, and the rear face of bezel member 144 includes one or more mounting members 152 for the releasable attachment to mounting holes 142 of panel assembly 112. Turning to bezel member 146, exemplary bezel member 146 includes an aperture or slot 313, with aperture 313 configured and dimensioned to have a connector assembly/connective device 14C mounted with respect thereto (FIG. 23). Similar to bezel member 144, the front face of bezel member 146 includes one or more handle members 150, and the rear face of bezel member 146 includes one or more mounting members 152 for the releasable attachment to mounting holes 142 of panel assembly 112. Exemplary connector assembly 14C takes the form of a fiber optic cassette 14C having a plurality of fiber optic ports/adapters (e.g., 12 ports) for mating with fiber optic connectors.

Figure 25:
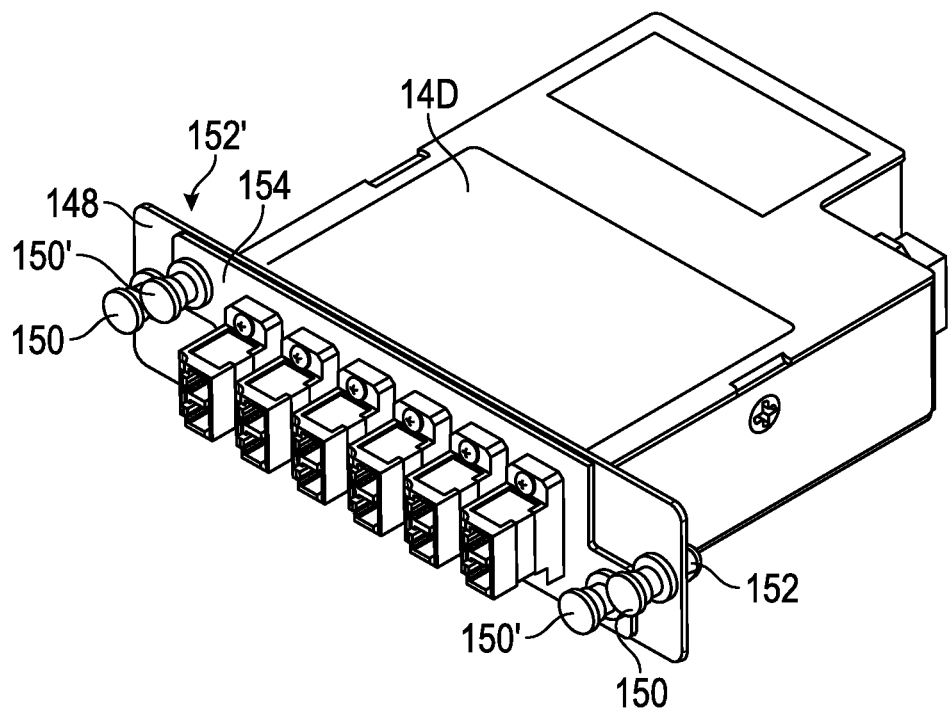
FIG. 25 is a front, perspective view of the bezel member of FIG. 24, after an exemplary connector assembly is mounted to the bezel member.

With reference to bezel member 148, exemplary bezel member 148 includes an aperture or slot 413, with aperture 413 configured and dimensioned to have a connector assembly/connective device 14D mounted with respect thereto (FIG. 25). Similar to bezel member 144, the front face of bezel member 148 includes one or more handle members 150, and the rear face of bezel member 148 includes one or more mounting members 152 for the releasable attachment to mounting holes 142 of panel assembly 112.

In certain embodiments, connector assembly 14D includes a mounting plate 154, with the front face of mounting plate 154 having one or more handle members 150', and the rear face of mounting plate having one or more mounting members 152' for the releasable attachment to mounting holes 142' of bezel member 148. Exemplary connector assembly 14D takes the form of a fiber optic cassette 14D having a plurality of fiber optic ports/adapters (e.g., 12 ports) for mating with fiber optic connectors.

It is noted that panel assembly 112 of media patching system 100 can include any number, combination and/or permutation of bezel members 144, 146 and/or 148, and thus can include any number, combination and/or permutation of connector assemblies/connector devices 14, 14A, 14B, 14C and/or 14D. As such, panel assembly 112 can include connector assemblies 14, 14A, 14B, 14C and/or 14D (alone or in combinations thereof). Thus, panel assembly 112 of media patching system 100 advantageously provides users with the ability to install multiple media connections (e.g., copper-based connections 14, fiber optic connections 14A, 14B, 14C, 14D, combinations thereof, or the like) in the same patching system/enclosure 100. Moreover, panel assembly 112 can advantageously increase patching density of the media patching system 100 while maintaining port accessibility.

Figure 28:
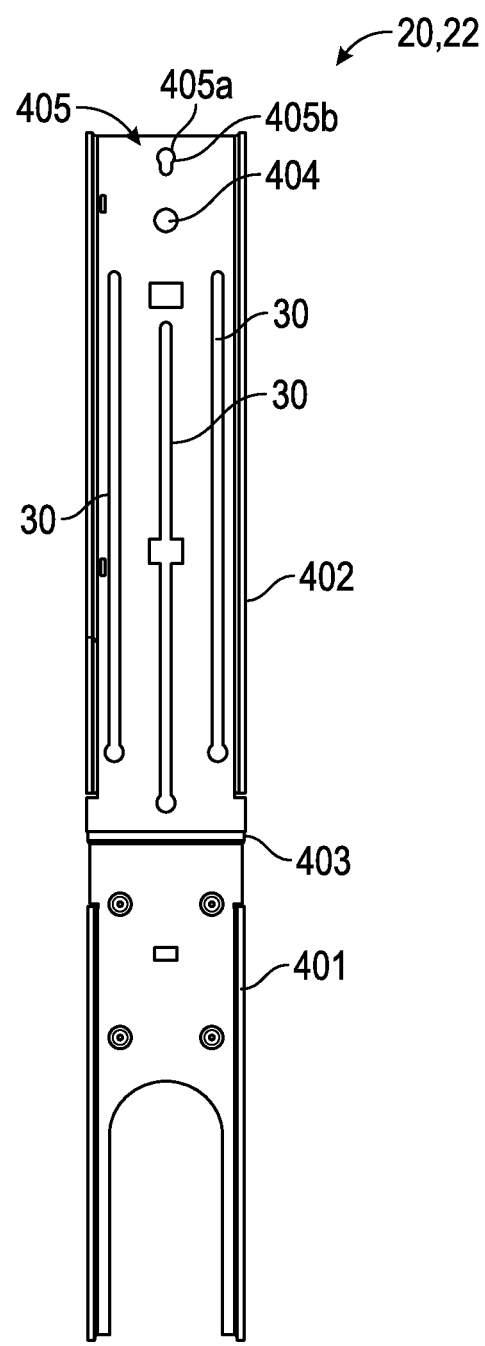
FIG. 28 is a side view of the exemplary frame member of FIG. 9.
Figure 29:
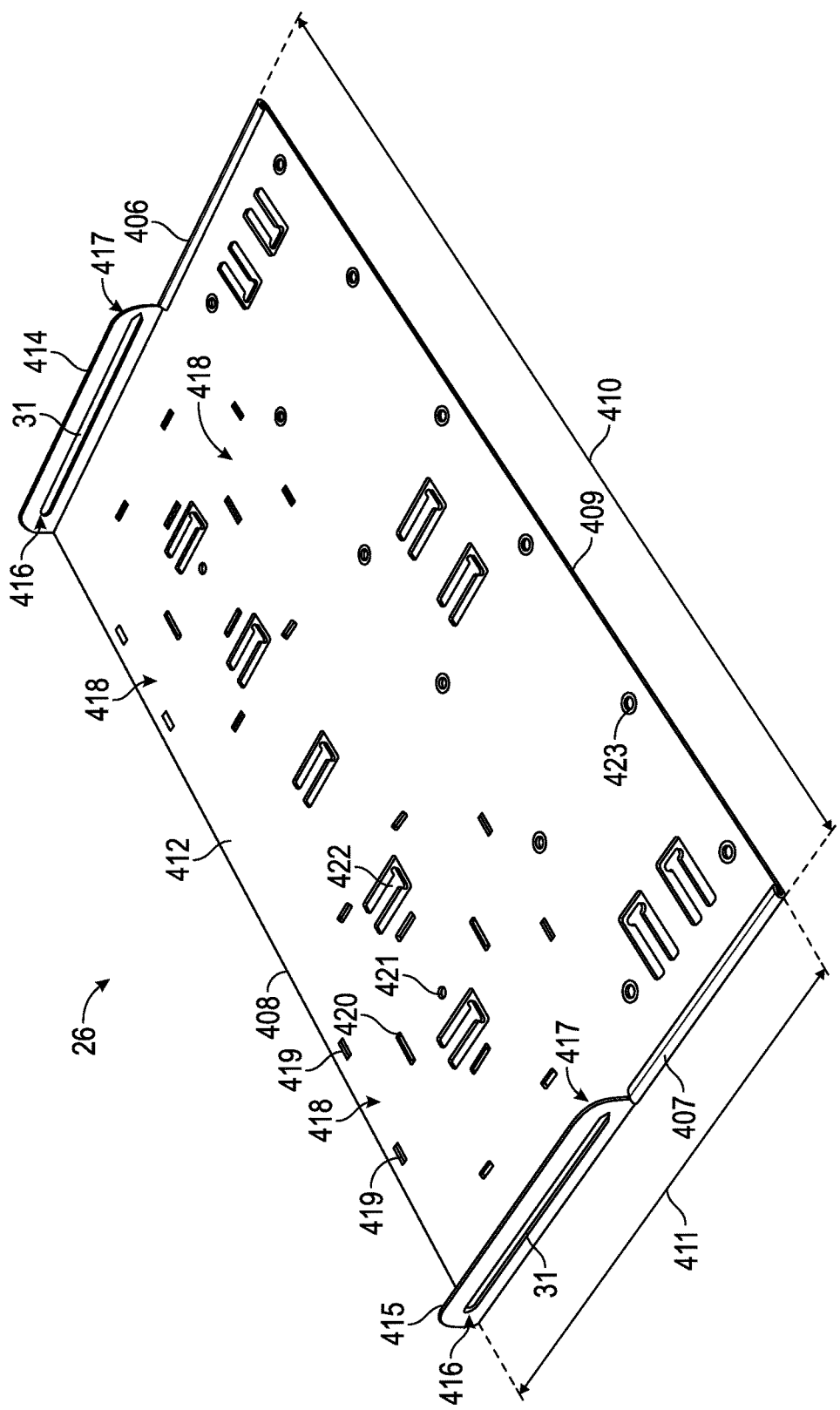
FIG. 29 is a top, perspective view of an exemplary upper cable management plate according to the present disclosure.
Figure 30:
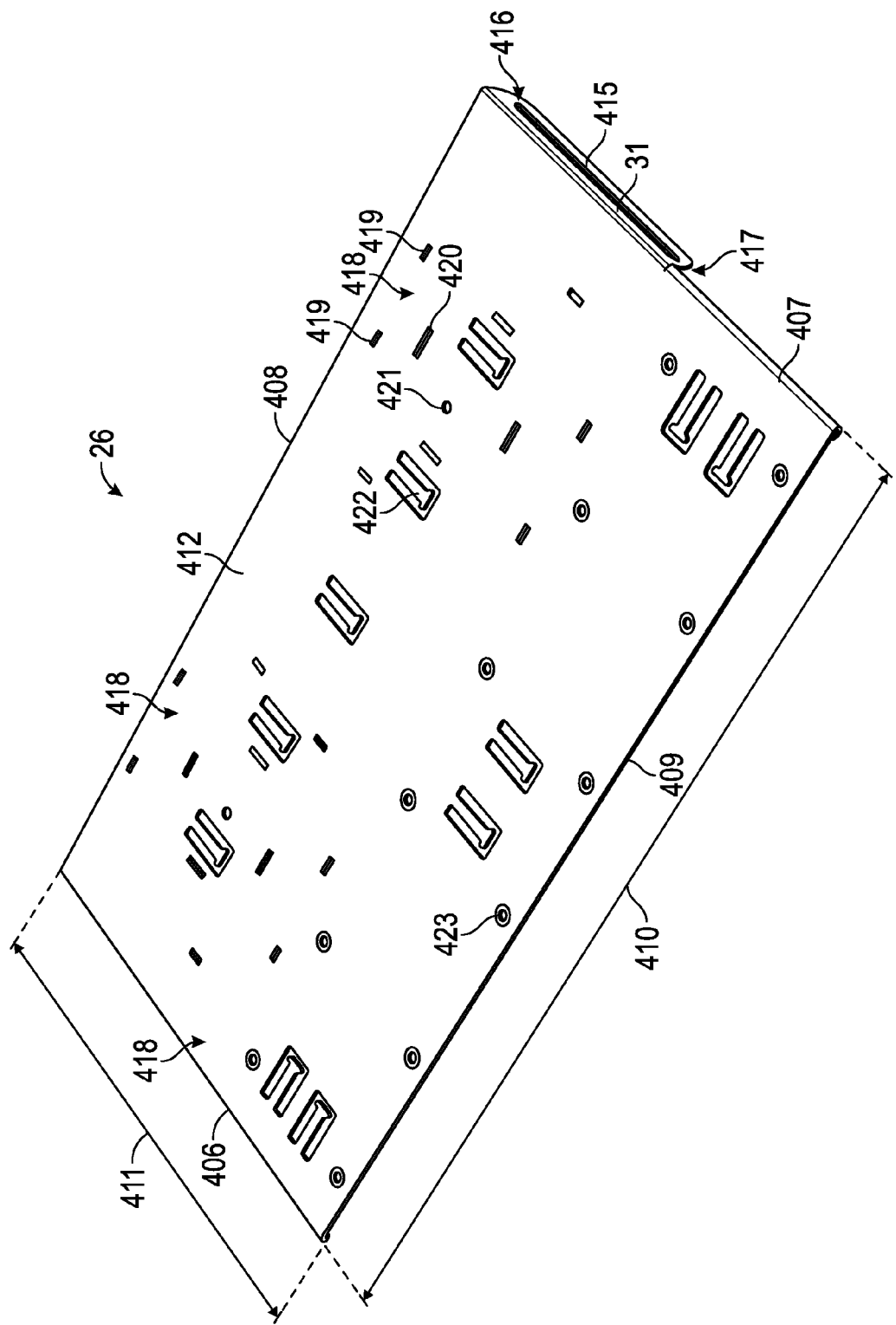
FIG. 30 is a bottom, perspective view of an exemplary upper cable management plate of FIG. 29.
Figure 31:
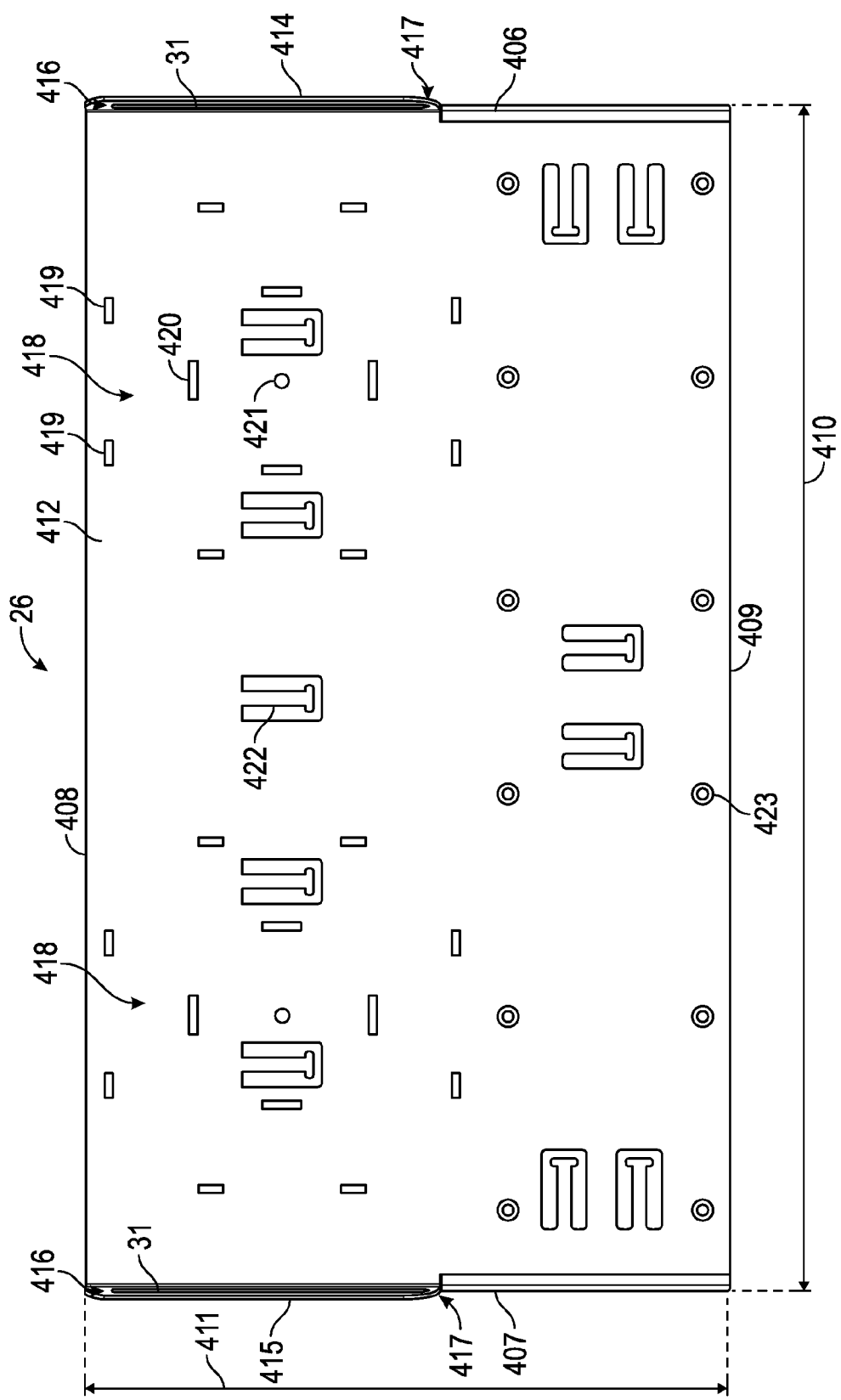
FIG. 31 is a top view of an exemplary upper cable management plate of FIG. 29.
Figure 32:
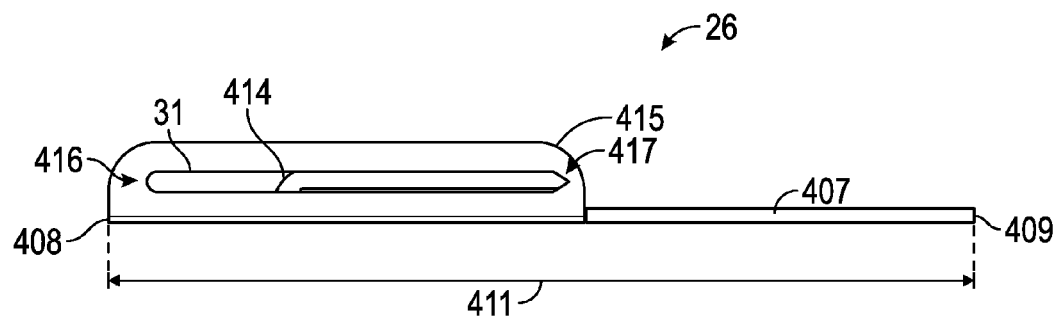
FIG. 32 is a side view of an exemplary upper cable management plate of FIG. 29.

With reference to FIGS. 9 and 28, perspective and side views of exemplary frame member 20, 22 are provided. Frame members 20, 22 can define a substantially z-shaped configuration, including a first longitudinal run 401, a second longitudinal run 402, and a first lateral run 403 connecting the first and second longitudinal runs 401, 402. First and second longitudinal runs 401, 402 can be substantially parallel relative to each other and define the sides of the media patching system 10. Slots 30 can extend along the length defined by second longitudinal run 402. First lateral run 403 can be substantially perpendicular to first and second longitudinal runs 401, 402.

Each of frame members 20, 22 includes a first aperture 404 and a second aperture 405 spaced relative to each other and passing through the second longitudinal run 402. First aperture 404 defines a circular shape. Second aperture 405 includes a large diameter portion 405a and a small diameter portion 405b. As will be discussed in greater detail below, the first and second apertures 404, 405 can be used to detachably secure a bracket 34 (shown in FIG. 34) to the frame members 20, 22.

Turning now to FIGS. 29-32, perspective, top and side views of an exemplary upper cable management plate 26 of a cable management plate assembly are provided. Upper cable management plate 26 can define a substantially rectangular configuration, including first and second side edges 406, 407, a front edge 408, and a rear edge 409. Front and rear edges 408, 409 define a width 410 of upper cable management plate 26 and first and second side edges 406, 406 define a depth 411 of upper cable management plate 26. The width 410 can be dimensioned such that upper cable management plate 26 can be positioned between the first and second frame members 20, 22.

Upper cable management plate 26 includes a substantially planar body portion 412 extending between first and second side edges 406, 407, front edge 408, and rear edge 409. Each of the first and second side edges 406, 407 includes a flange 414, 415 extending therefrom in a direction perpendicular to the plane defined by body portion 412. Body portion 412 can define a cable supporting surface of upper cable management plate 26. Flanges 414, 415 extend a partial distance along depth 411. In particular, flanges 414, 415 extend from front edge 408 to an approximate midpoint of depth 411. In some embodiments, the length of flanges 414, 415 can be varied to change the distance which upper cable management plate 26 can slide and extend from the rear portion of media patching system 10. Although discussed herein with respect to media patching system 10, it should be understood that upper cable management plate 26 can be used in conjunction with a variety of media patching systems or racks.

Each flange 414, 415 includes an elongated slot 31, e.g., a track, formed therein along which upper cable management plate 26 can slide or move relative to first and second frame members 20, 22. Each slot 31 includes a proximal end 416 and a distal end 417. In particular, proximal end 416 can be disposed near front edge 408 and distal end 417 can be disposed near the midpoint of upper cable management plate 26. Proximal end 416 can define a substantially circular or rounded edge of elongated slot 31. Distal end 417 can define an angled, pointed end of elongated slot 31 formed by two converging linear lines.

In some embodiments, body 412 includes one or more groups of slots 418 formed thereon. In particular, groups of slots 418 include two slots 419 which are aligned and parallel to each other, and a slot 420 which is offset from and parallel to slots 419. In some embodiments, four groups of slots 418 can be positioned circumferentially around a central bore 421. As will be discussed in greater detail below, groups of slots 418 can be used to detachably secure one or more spools 28 to body 412.

In some embodiments, body 412 includes one or more tabs 422 formed therein for organizing cables on upper cable management plate 26. Tabs 422 can define T-shaped portions extending parallel to the plane defined by body 412. One or more cables supported by upper cable management plate 26 can be detachably secured to tabs 422 by, e.g., VELCRO® straps, or the like. Cables can thereby be tightened to and held in place against body 412.

In some embodiments, body 412 includes one or more apertures with a threaded insert 423 positioned therein. Threaded inserts 423 can be used to secure additional cable management or organization components to upper cable management plate 26.

Figure 33:
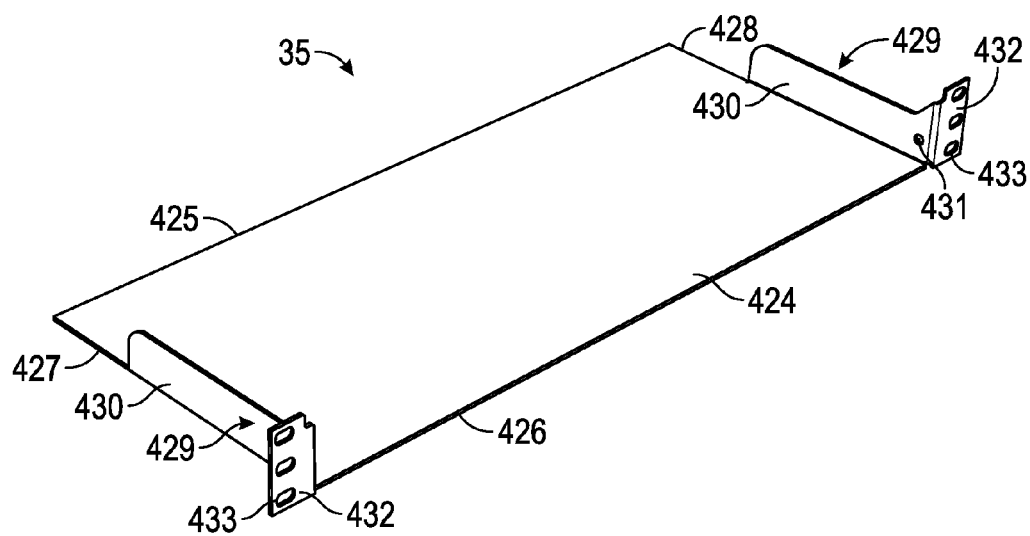
FIG. 33 is a perspective view of an exemplary lower cable management plate according to the present disclosure.

FIG. 33 shows a perspective view of an exemplary lower cable management plate 35 of media patching system 10. Together, upper cable management plate 26 and lower cable management plate 35 interconnect to form a cable management plate assembly. Additionally, components such as spools, can be added to the cable management plate assembly formed by upper cable management plate 26 and lower cable management plate 35. Lower cable management plate 35 includes a planar body 424 with a front edge 425, a rear edge 426, and first and second side edges 427, 428. Each of the first and second side edges 427, 428 includes a flange 429, e.g., an L-shaped flange, extending perpendicularly relative to body 424. Each flange 429 includes a first portion 430 extending parallel to the respective first and/or second side edge 427, 428. In particular, first portion 430 extends a partial distance from rear edge 426 to a point offset from front edge 425. First portion 430 includes an aperture 431 that is involved in the connection of the upper cable management plate 26 to the lower cable management plate 35 in a manner that is explained below. Each flange 429 further includes a second portion 432 extending approximately ninety degrees from first portion 430 and extending parallel to rear edge 426. Second portion 432 extends away from body 424. Second portion 432 can include two or more openings 433 formed therein.

Figure 34:
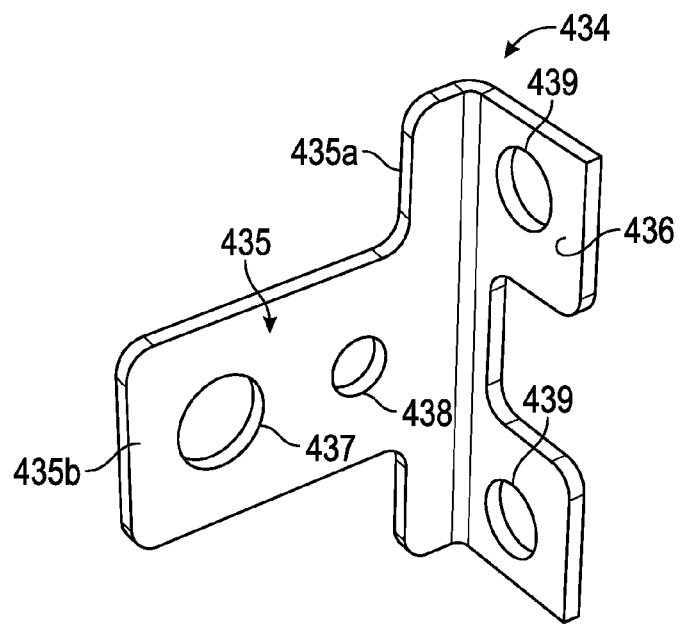
FIG. 34 is a perspective view of an exemplary bracket according to the present disclosure.

FIG. 34 shows a perspective view of an exemplary bracket 434. As discussed below, bracket 434 assists in interlocking lower cable management plate 35 to first and second frame members 20, 22. Bracket 434 can define a substantially L-shaped configuration including a first portion 435 and a second portion 436 extending at approximately ninety degrees relative to each other. First portion 435 includes an inner surface 435a and an outer surface 435b. First portion 435 includes two apertures 437, 438, e.g., circular openings, formed therein which are complementary to respective first and second apertures 404, 405 of first and second frame members 20, 22. Second portion 436 includes two separated extensions, each including an aperture 439 complementary to an opening 433 formed in second portion 432 of lower cable management plate 35.

Figure 35:
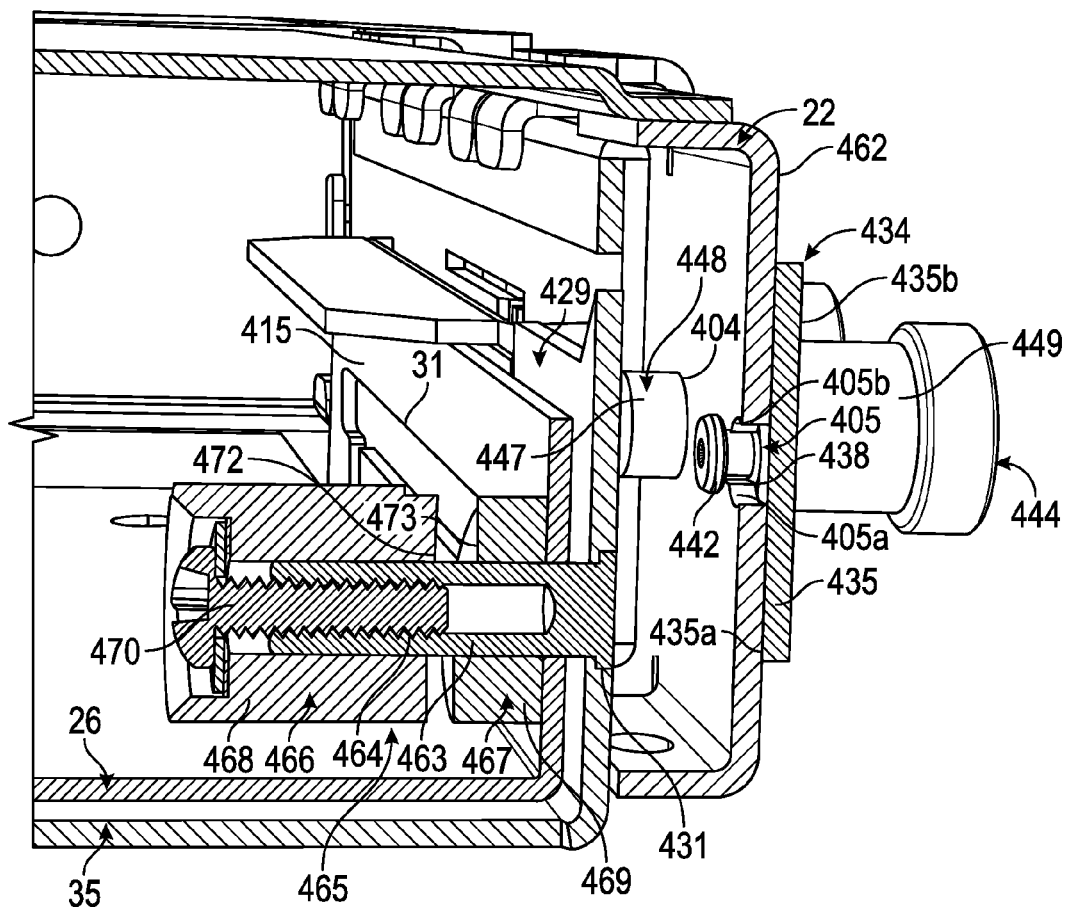
FIG. 35 is a cross-sectional view of a partial assembly of an exemplary media patching system of FIG. 1, including first and second frame members, lower cable management plate, upper cable management plate, and a bracket.

FIG. 35 is a perspective cut away view that shows the bracket 434 connected to a frame member 22. It should be understood that a bracket 434 can be connected to frame member 20 in a substantially similar manner. A pem 442 can be compression fit into opening 438 in bracket 434 such that the pem 442 extends from the inner surface 435a of the first portion 435 of the bracket 434 and passes through opening 405 in the frame member 20. In particular, the pem 442 can pass freely through the large diameter opening 405a and can be configured to prevent passage of the pem 442 through the small diameter opening 405b. A spring-loaded pin assembly 444 can also be mated with the bracket 434. The spring-loaded pin assembly 444 includes a housing 449 that can be compression fit into opening 437 of the bracket 434 such that the spring-loaded pin assembly 444 extends from the outer surface 435b of the first portion 435 of the bracket 434. An end portion 447 of a pin body 448 disposed within the pin housing 449 can extend from the inner surface 435a of the first portion 435 of the bracket 434 and passes through opening 404 in the frame member 20.

Figure 36:
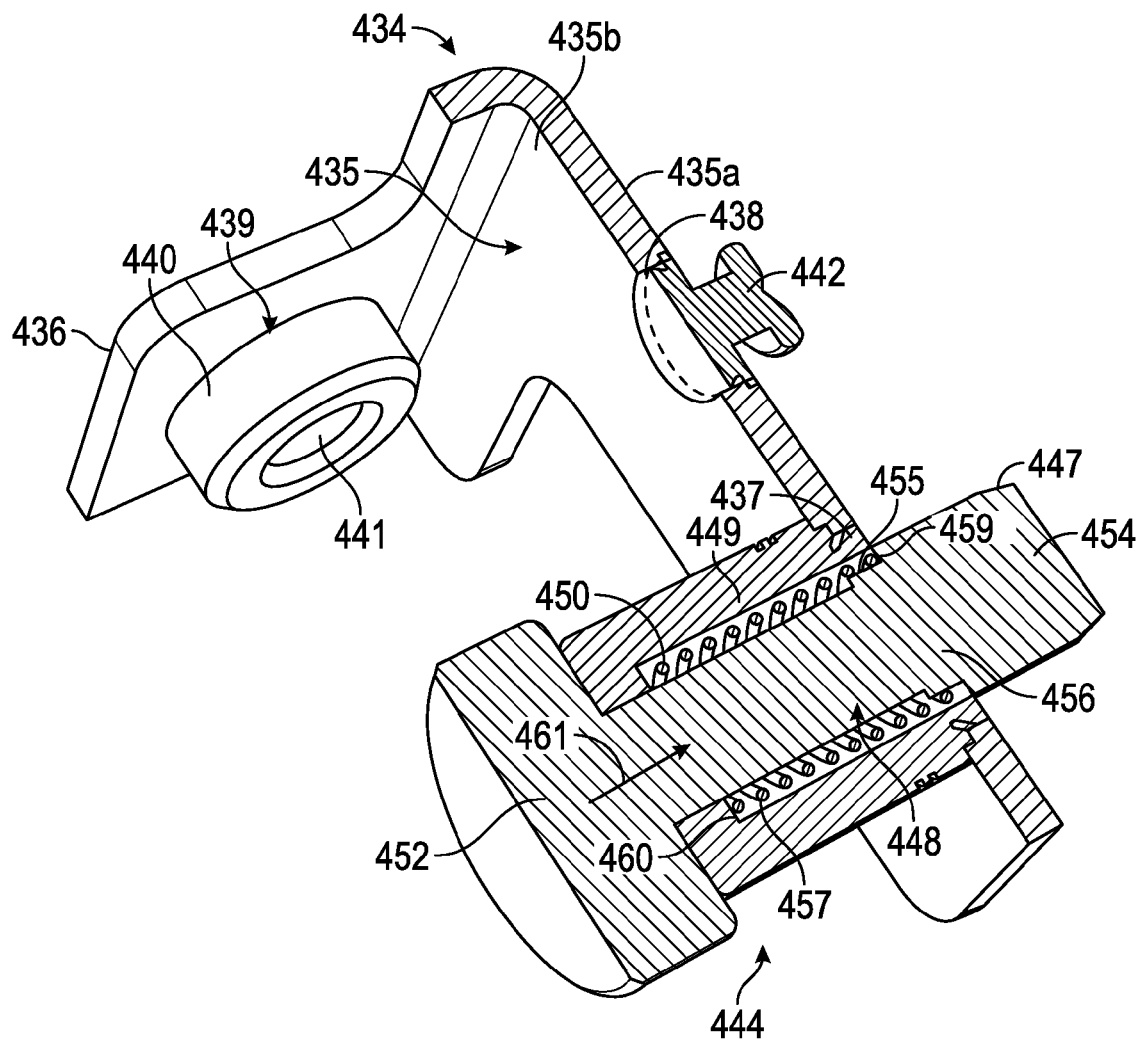
FIG. 36 is a cross-sectional view of a partial assembly of an exemplary media patching system of FIG. 1, including a bracket and a spring-loaded pin assembly.

FIG. 36 is a cross-sectional view of spring-loaded pin assembly 444 mated with bracket 434. The spring-loaded pin assembly 444 includes a pin body 448 that can translate inside a cavity or opening 450 formed in the pin housing 449. The pin body 448 includes a head 452 on one end that is always disposed outside of the housing 449, a small diameter region 456 extending from the head 452 and through the opening 450 in the housing 449, and a large diameter region 454 disposed at an opposing end of the small diameter region 456 relative to the head 452. In some embodiments, the pin body 448 can include an intermediate diameter region 455 disposed between the small diameter region 456 and the large diameter region 454. The transition from the small diameter region 454, the intermediate diameter region 455, and the large diameter region 454 can be formed in a stepped manner. A spring 457 can be disposed within the opening 450 and around the pin body 448. In particular, the spring 457 can be disposed between a face 459 of the large diameter region 454 of the pin body 448 and a face 460 of housing 449, thereby biasing the head 452 of the pin body 448 towards the housing 449 in the direction indicated by arrow 461.

In some embodiments, an internally threaded member 440 can be detachably mated with the bracket 434. In particular, the internally threaded member 440 can be compression fit into the aperture 439 of the bracket 434 such that the member 440 can extend from the second portion 436 adjacent to the outer surface 435b of the first portion 435 of the bracket 434. The . threaded internal aperture 441 of the member 440 can be aligned with the aperture 439. Thus, rather than manipulating a nut to ensure alignment of the nut with a fastening member when connecting the bracket 434 to the lower cable management plate 35, the internally threaded member 440 can remain attached to the bracket 434 to continuously provide a fastening portion in the bracket 434 that is aligned and ready to receive a fastening member. The internally threaded member 440 therefore improves efficiency in assembling the bracket 434 and the lower cable management plate 35.

With reference to FIGS. 35-41, the bracket 434 can be connected to frame member 22 as follows. The bracket 434 can be positioned on the outer surface 462 of the frame member 22 such that the pem 442 extending from the inner surface 435a of the first portion 435 of the bracket 434 passes through the large diameter portion 405a of the opening 405 in the frame member 22, e.g., a first position of the bracket 434. In the first position, the pin body 448 of the spring-loaded pin assembly 444 is not aligned with the opening 404 of the frame member 22, and therefore cannot yet pass through the opening 404 of the frame member 22. The bracket 434 can be slid backward such that the pem 442 moves or slides into the small diameter portion 405b of the opening 405 in the frame member 22, e.g., a second position of the bracket 434. When the bracket 434 is in the second position, the pin body 448 is aligned with the opening 404 and passes through the opening 404 due to the force of the spring 457 inside pin assembly 444. In particular, the spring 457 biasing the pin body 448 forces a portion of the large diameter region 454 into the opening 404 to interlock the bracket 434 with the frame member 22. The spring-loaded pin assembly 444 therefore acts as a quick release mechanism for connecting and disconnecting the bracket 434 from the frame members 20, 22.

Figure 38:
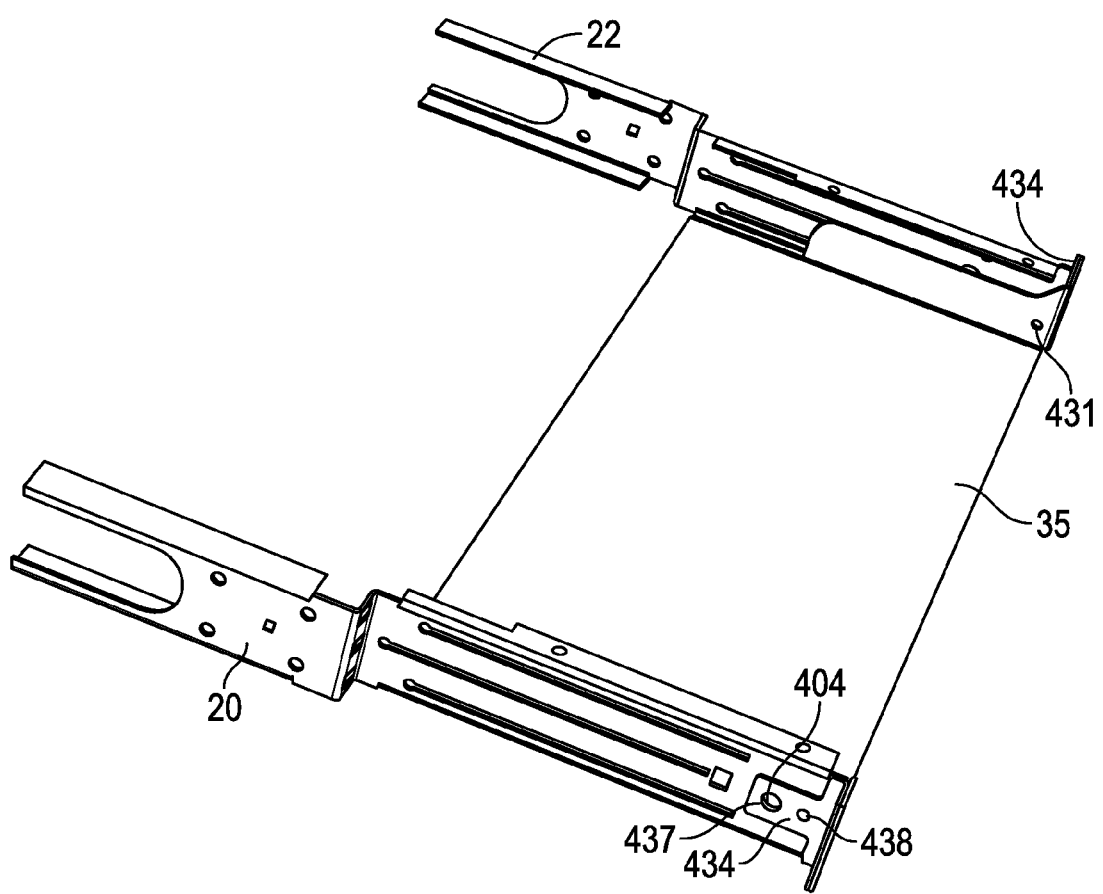
FIG. 38 is a perspective view of a partial assembly of an exemplary medial patching system of FIG. 1, including first and second frame members, lower cable management plate, and brackets.
Figure 39:
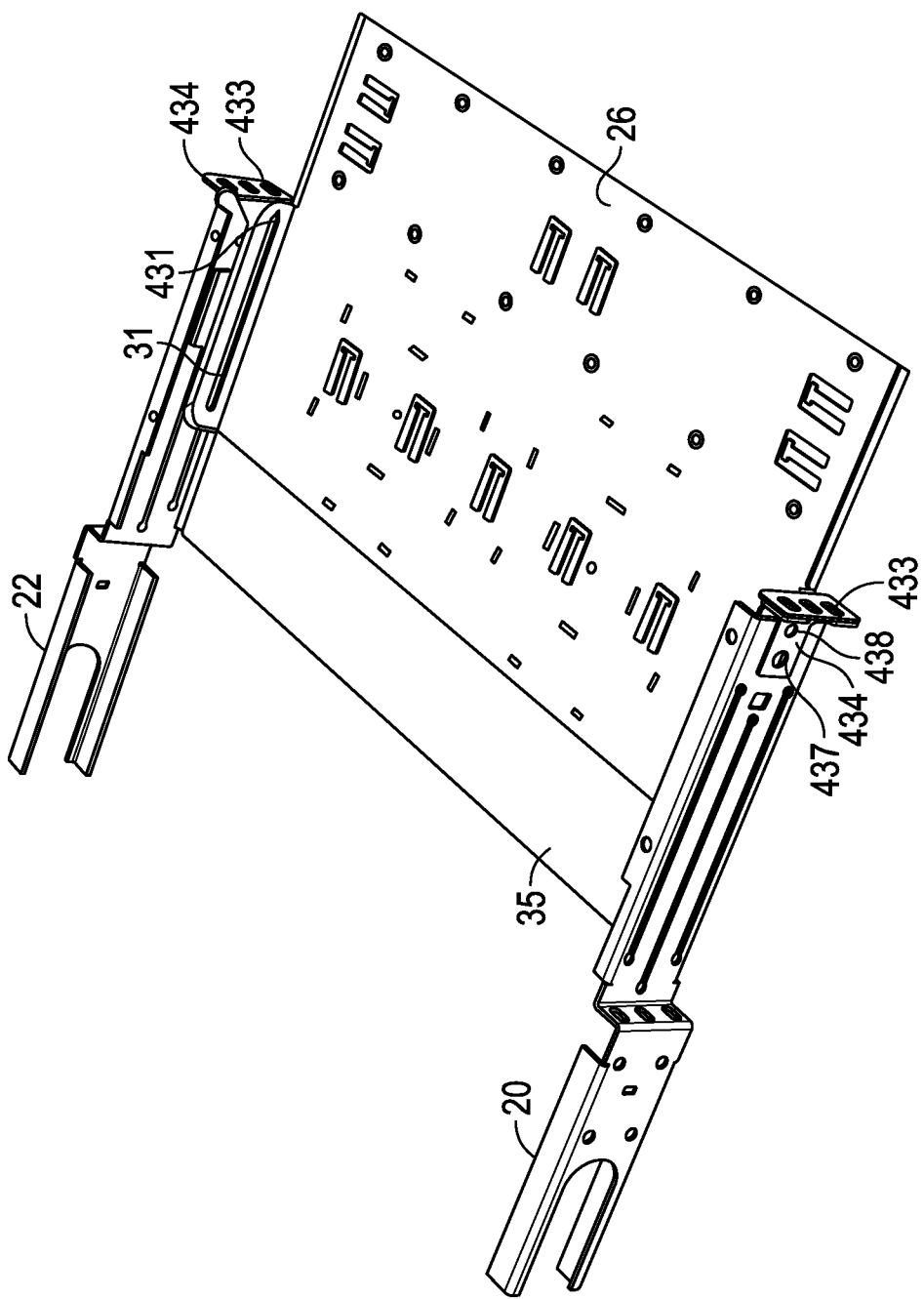
FIG. 39 is a perspective view of a partial assembly of an exemplary medial patching system of FIG. 1, including first and second frame members, lower cable management plate, brackets, and upper cable management plate.
Figure 40:
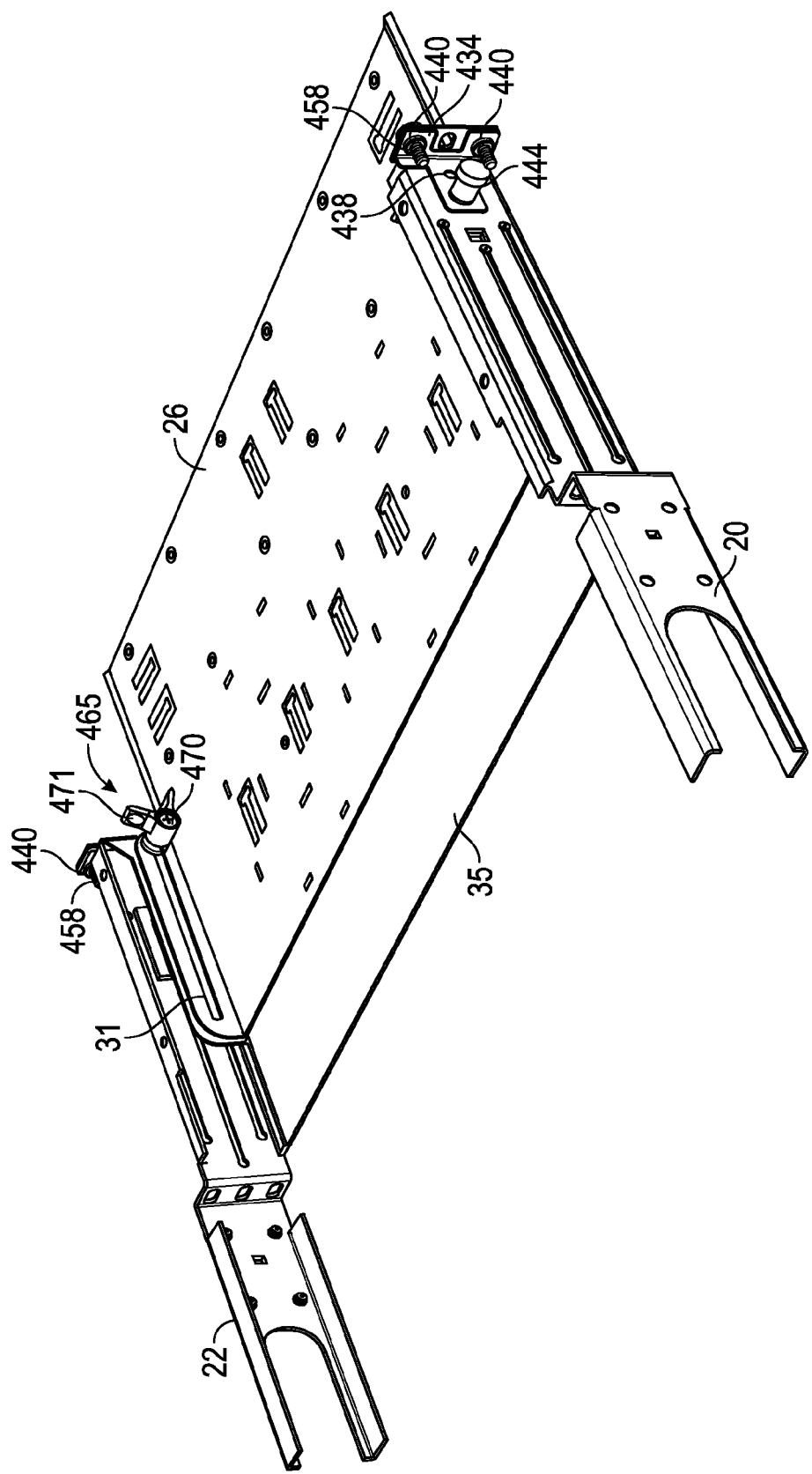
FIG. 40 is a perspective view of a partial assembly of an exemplary media patching system of FIG. 1, including first and second frame members, lower cable management plate, brackets, upper cable management plate, and spring-loaded pin assemblies.
Figure 41:
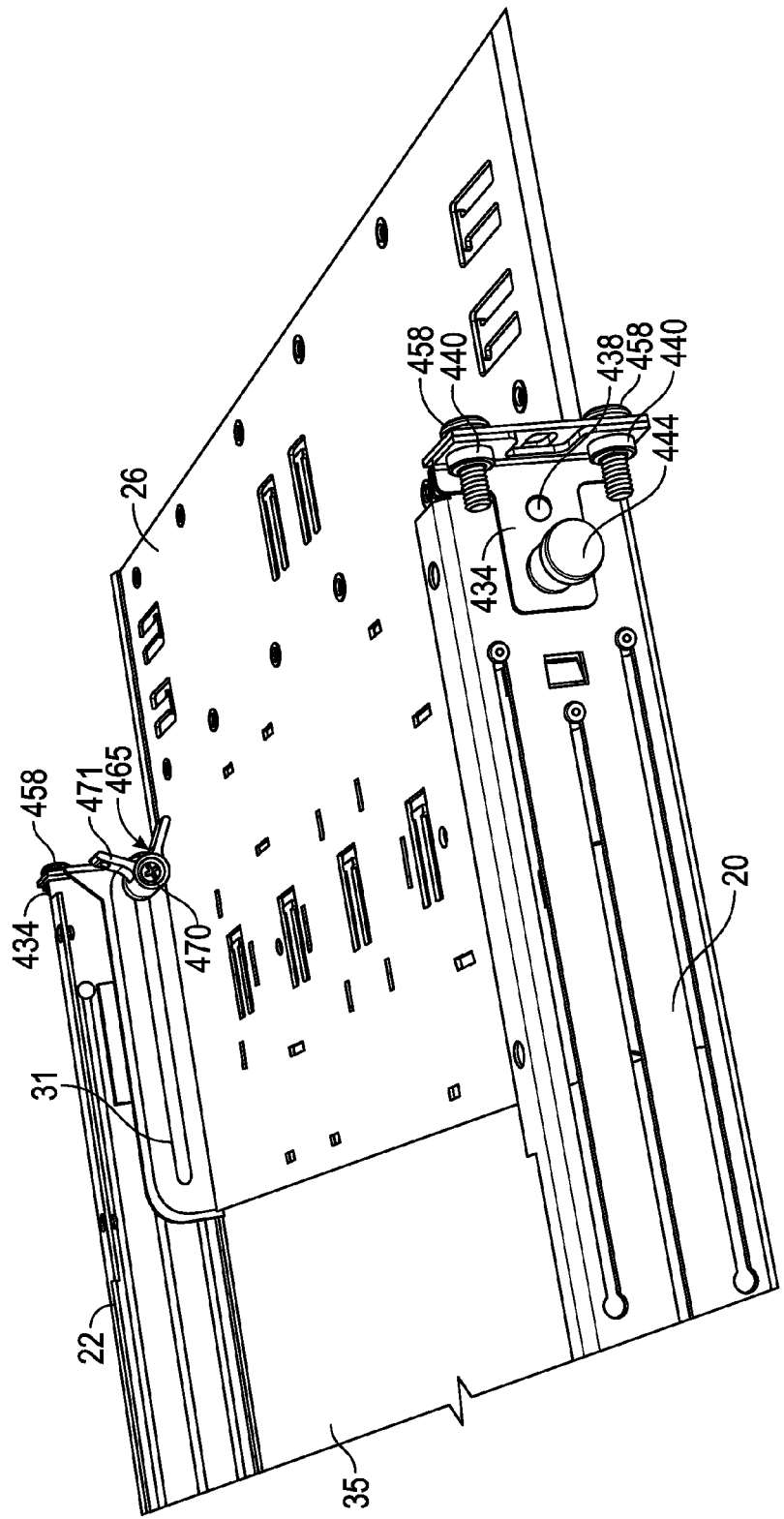
FIG. 41 is a detailed, perspective view of a partial assembly of an exemplary media patching system of FIG. 1, including first and second frame members, lower cable management plate, brackets, upper cable management plate, and spring-loaded pin assemblies.

Once the bracket 434 has been connected to each frame member 20, 22, lower cable management plate 35 can be detachably fixed to the frame members 20, 22 by positioning flanges 429 of lower cable management plate 35 against the bracket 434 such that openings 433 of the lower cable management plate 35 and apertures 439 of bracket 434 are aligned (see FIGS. 38 and 39). When the openings 433 and apertures 439 are aligned, panel mounting screws 458 can be passed through the openings 433 and apertures 439 and screwed into internally threaded pieces 440 to secure the lower cable management plate 35 to brackets 434 and, thereby, to the first and second frame members 20, 22 (see FIGS. 40 and 41).

FIG. 35 further shows a detailed view of how the upper cable management plate 26 is mounted to the lower cable management plate 35 such that the upper cable management plate 26 can slide relative to the lower cable management plate 35. In particular, one end of a pem 463 can be compression fit into opening 431. The pem 463 thereby extends inward from the flange 429 of the lower cable management plate 35 and passes through slot 31 in flange 415 of the upper cable management plate 26. The pem 463 includes an internally threaded bore 464 extending therein. A thumb latch 465, e.g., a fastening member, including a first cylindrical portion 466 with a first cam portion 468 and a second cylindrical portion 467 with a second cam portion 469, e.g., a cam lock mechanism, is mounted to the outer surface of the pem 463.

The second cylindrical portion 467 can be rotationally fixed to the pem 463. The first cylindrical portion 466 can be attached to the pem 463 with a screw 470. The screw 470 includes threads complementary to the threads of the pem 463 such that the screw 470 can mate with the internally threaded bore 464. The second cylindrical portion 467 can rotate about pem 463 and can be manipulated to rotate in either direction with fingers 471 (see FIGS. 40 and 41). When the first cylindrical portion 466 of the thumb latch 465 is disposed in a release position or configuration, the upper cable management plate 26 can slide relative to the lower cable management plate 35 with pem 463 riding or sliding within slot 431. In particular, in the release position or configuration, a first cam surface 472 of the first cam portion 468 can be disposed in a spaced relation relative to the second cam surface 473 of the second cam portion 469 along the pem 463.

When the first cylindrical portion 466 of the thumb latch 465 is rotated into a locking position or configuration, the first cam surface 472 can interact with the second cam surface 473 to push the second cylindrical portion 467 towards the inner surface of flange 415 of the upper cable management plate 26. In particular, the first cylindrical portion 466 can be rotated along the pem 463 to rotate the screw 470 deeper into the internally treaded bore 464 of the pem 463. The first cam surface 472 can thereby press against the second cam surface 473 to push the second cylindrical portion 467 against the inner surface of flange 415 of the upper cable management plate 26.

The friction force created between the second cylindrical portion 467 and the flange 415 of the upper cable management plate 26 fixates or secures the upper cable management plate 26 to the lower cable management plate 35 such that the upper cable management plate 26 cannot translate relative to the lower cable management plate 35. In particular, the pressure of the second cylindrical portion 467 against the flange 415 prevents the pem 463 from sliding within the slot 31 of the flange 415. To release and move the upper cable management plate 26 relative to the lower cable management plate 35, the first cylindrical portion 466 can be rotated away from the second cylindrical portion 467 to release and allow sliding of the pem 463 within the slot 31 of the flange 415.

Figure 37:
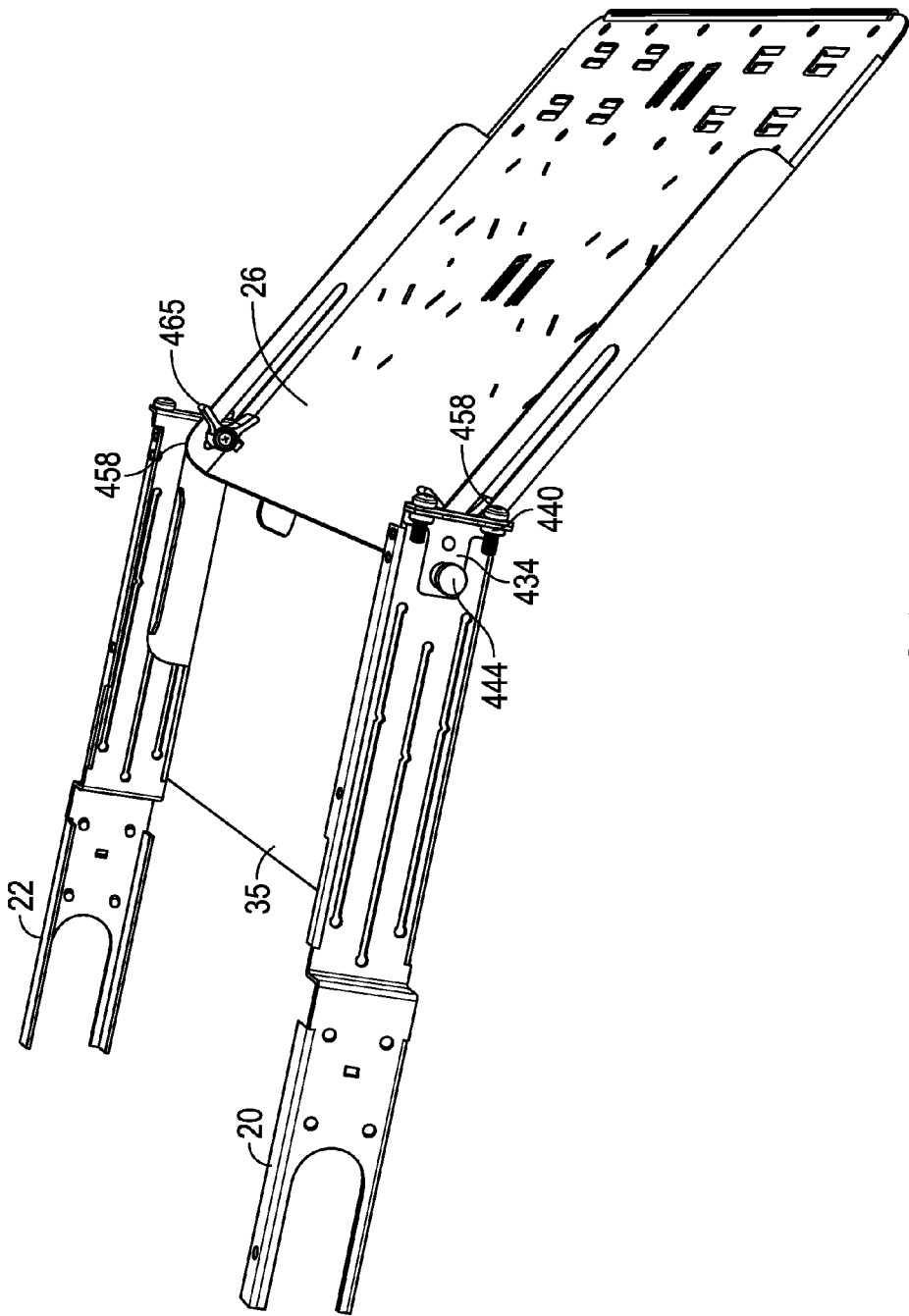
FIG. 37 is a perspective view of a partial assembly of an exemplary media patching system of FIG. 1, including first and second frame members, lower cable management plate, brackets, and upper cable management plate pivoted relative to lower cable management plate.

Thus, rather than removing the entire media patching system 10 from the rack 350, to access cables supported by upper cable management plate 26, upper cable management plate 26 can slide out from the rear of media patching system 10 (see FIG. 37). Upon at least partially extending upper cable management plate 26 from the rear of media patching system 10 along slots 31, pems 463 can act as hinges to at least partially allow upper cable management plate 26 to rotate or pivot relative to media patching system 10. In particular, the upper cable management plate 26 can slide along the pems 463 between the proximal end 416 and the distal end 417 of the slots 31 (see FIG. 32). At the proximal end 416 position, the upper cable management plate 26 can be positioned in a fully extended position relative to the lower cable management plate 35, and the rounded configuration of the proximal end 416 of the slot 31 allows variation in the pivot angle of the upper cable management plate 26 relative to the lower cable management plate 35. At the distal end 417 position, the upper cable management plate 26 can be positioned in a fully retracted position relative to the lower cable management plate 35. The upper cable management plate 26 can therefore pivot relative to first and second frame members 20, 22 and lower cable management plate 35 as is shown in FIG. 37. For example, upper cable management plate 26 can pivot in a downward direction relative to a plane defined by or parallel to first and second frame members 20, 22, lower cable management plate 35, or both. Greater access can thereby be provided to cables stored or organized on upper cable management plate 26.

Figure 42:
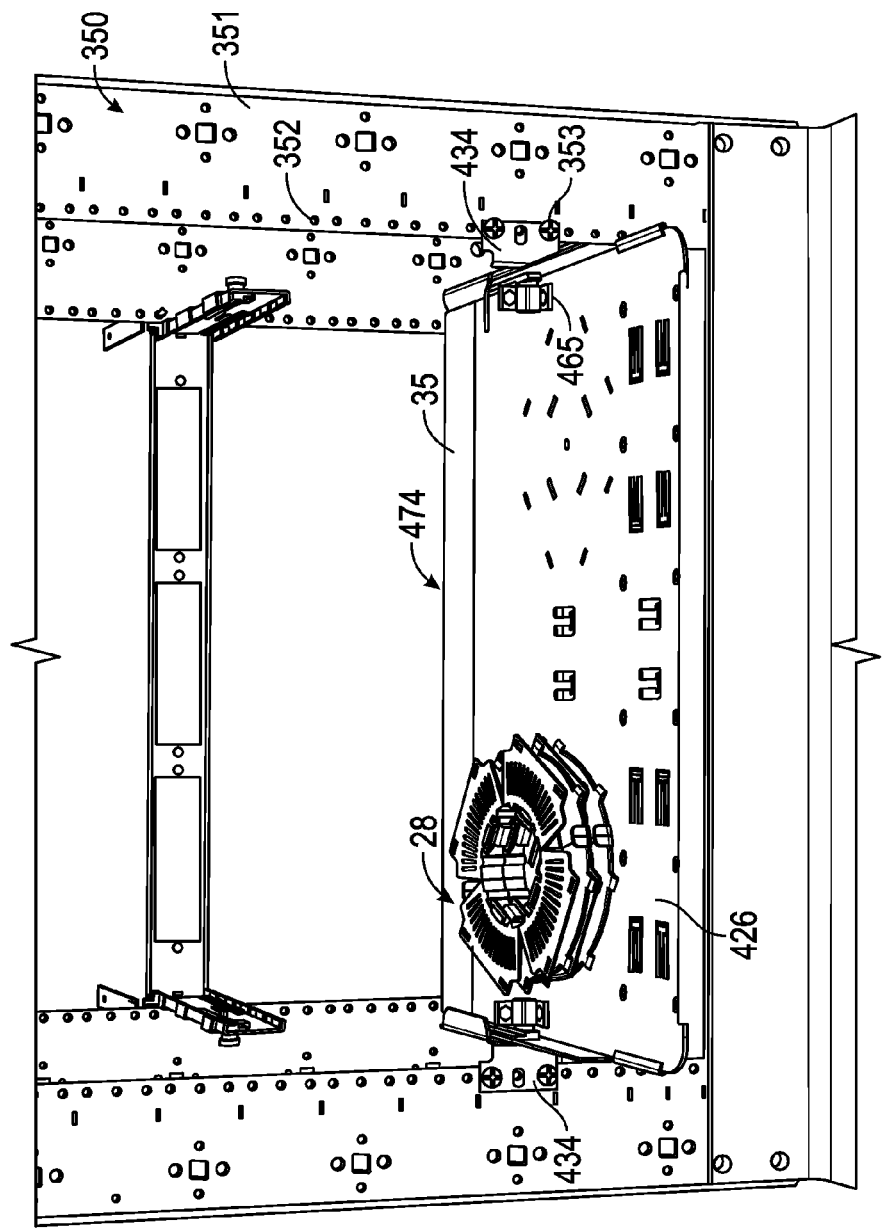
FIG. 42 is a rear, perspective view of a cable management plate assembly including lower cable management plate and upper cable management plate secured directly to a rack without first and second frame members.

Cable management plate assembly 474 includes the assembly of upper cable management plate 26 and lower cable management plate 35. In some embodiments, the cable management plate assembly 474 need not be connected to frame members 20, 22. Rather, as shown in FIG. 42, the cable management plate assembly 474 provides versatility in that the cable management plate assembly 474 can be connected directly to the back portions 351 of the uprights of the rack 350. In the configuration shown in FIG. 42, openings 433 in second portion 432 in flanges 429 of lower cable management plate 35 are not aligned with apertures 439 in bracket 434. Instead, openings 433 can be aligned with openings 352 formed in the back portions 351 of the uprights of rack 350 and panel mounting screws 353 can pass through the openings 433 and the corresponding openings 352 in the back portions 351 of the uprights of rack 350 to secure the cable management plate assembly 474 to the rack 350. The upper cable management plate 26 can be secured to the lower cable management plate 35 as describe above and can slide and pivot relative to the lower cable management plate 35 when the thumb latches 465 are disposed in the release position. Thus, the cable management plate assembly 474 can advantageously be located further back in the rack 350 when cable management in that location is needed or desired, and can be secured to the rack 350 independently of a media patching system 10.

Figure 43:
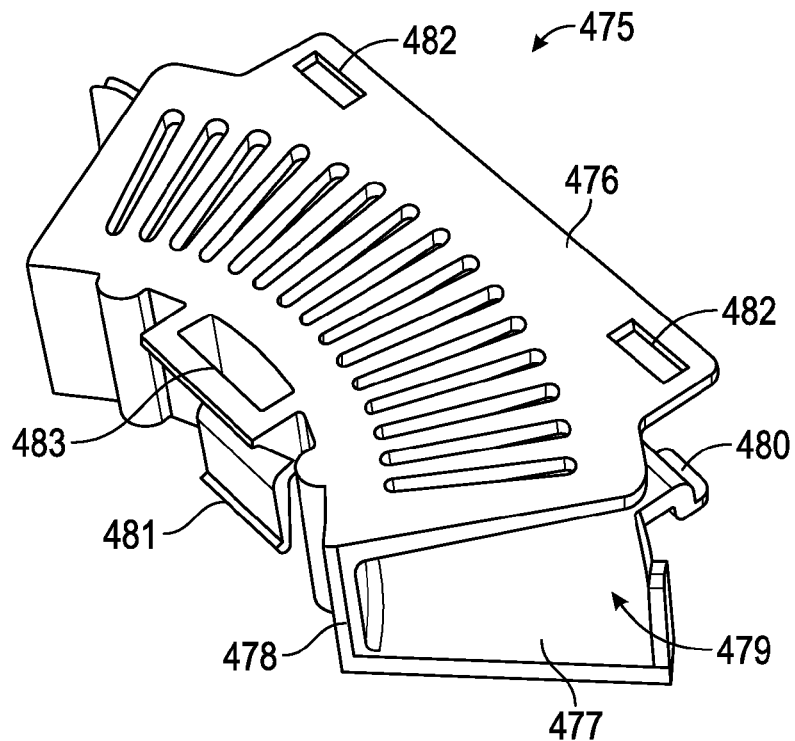
FIG. 43 is a top, perspective view of an exemplary quarter spool according to the present disclosure.
Figure 44:
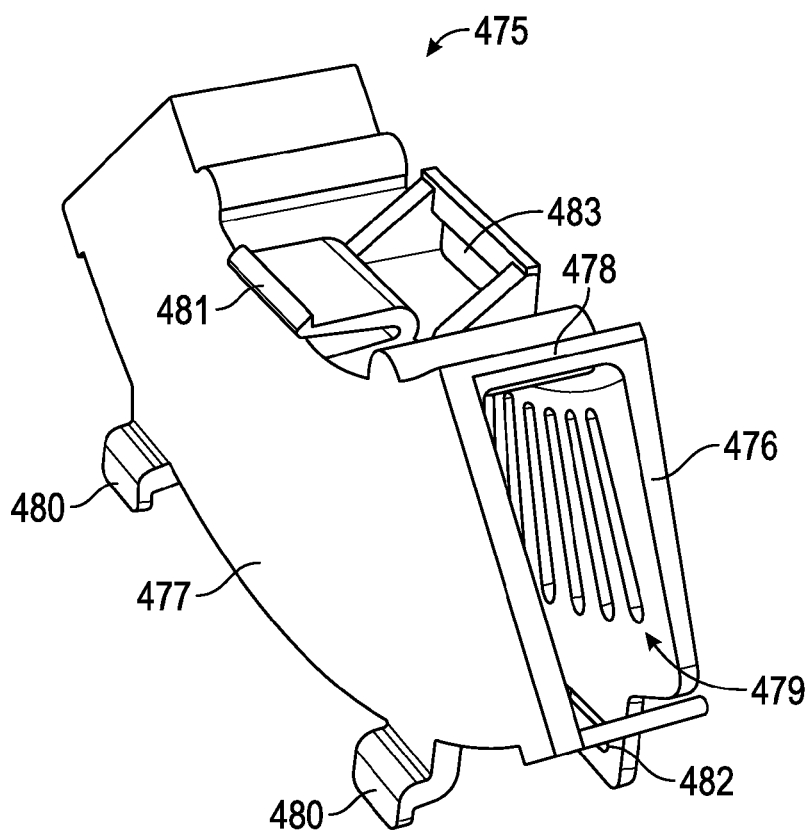
FIG. 44 is a bottom, perspective view of the exemplary quarter spool of FIG. 39.

FIGS. 43 and 44 show perspective views of an exemplary quarter spool 475. Quarter spool 475 includes a top surface 476 and a bottom surface 477 separated by an inner wall 478. Inner wall 478 connects top and bottom surfaces 476, 477 relative to each other and forms a cavity 479 between top and bottom surfaces 476, 477. Bottom surface 477 includes two S-shaped flanges 480 extending from an outer edge of quarter spool 475, and further includes a single U-shaped flange 481 on an opposing inner edge of quarter spool 475.

Flanges 480, 481 can be configured and dimensioned complementary to slots 419, 420 of upper cable management plate 26. In particular, flanges 480 can be complementary to slots 419 and flange 481 can be complementary to slot 420 such that quarter spools 475 can be mounted onto upper cable management plate 26. During assembly, flanges 480 can be inserted into slots 419 such that a portion of flanges 480 passes through slots 419. Flange 481 can be depressed and inserted into slot 420 to detachably lock quarter spool 475 to upper cable management plate 26. For example, upon release of flange 481, flange 481 can spring or snap outward within slot 420 and interlock the quarter spool 475 relative to upper cable management plate 26. One or more cables can be passed through cavity 479 and wrapped around quarter spool 475 to organize the cables on upper cable management plate 26.

Figure 45:
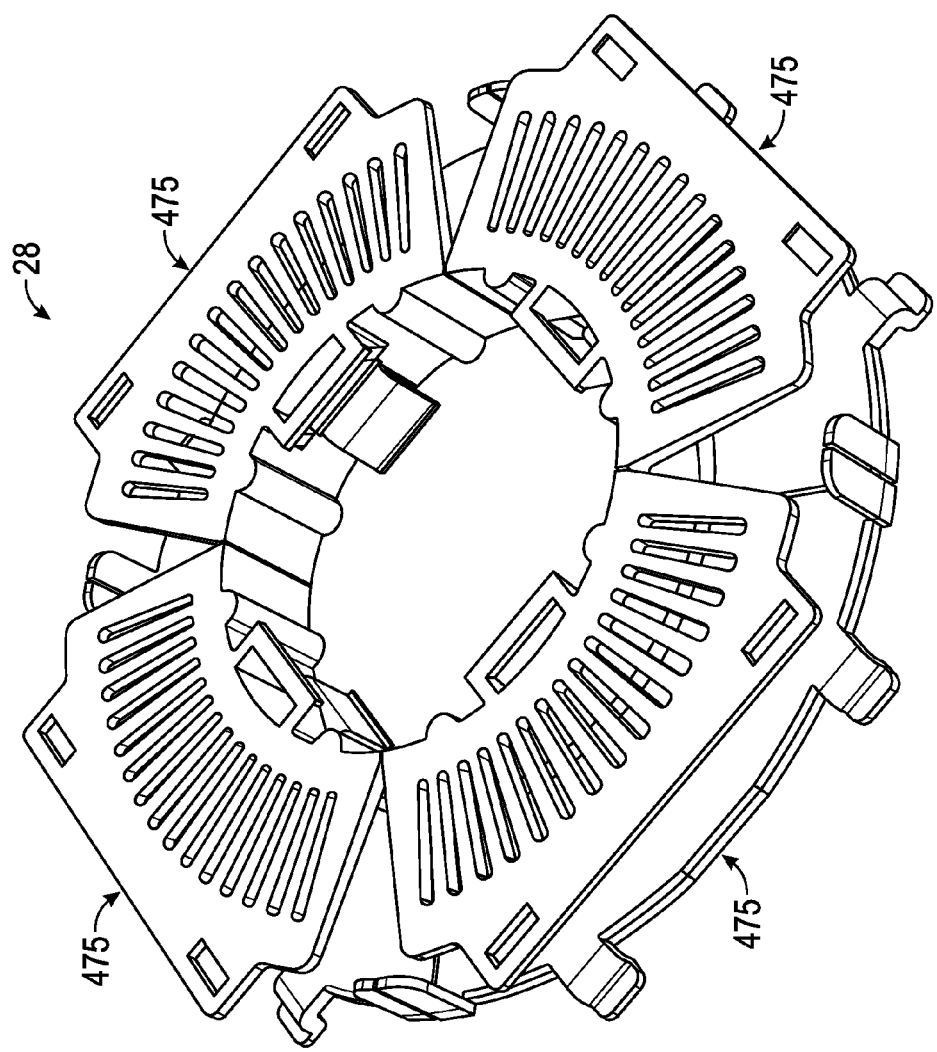
FIG. 45 is a perspective view of an exemplary spool assembly including four quarter spools.
Figure 46:
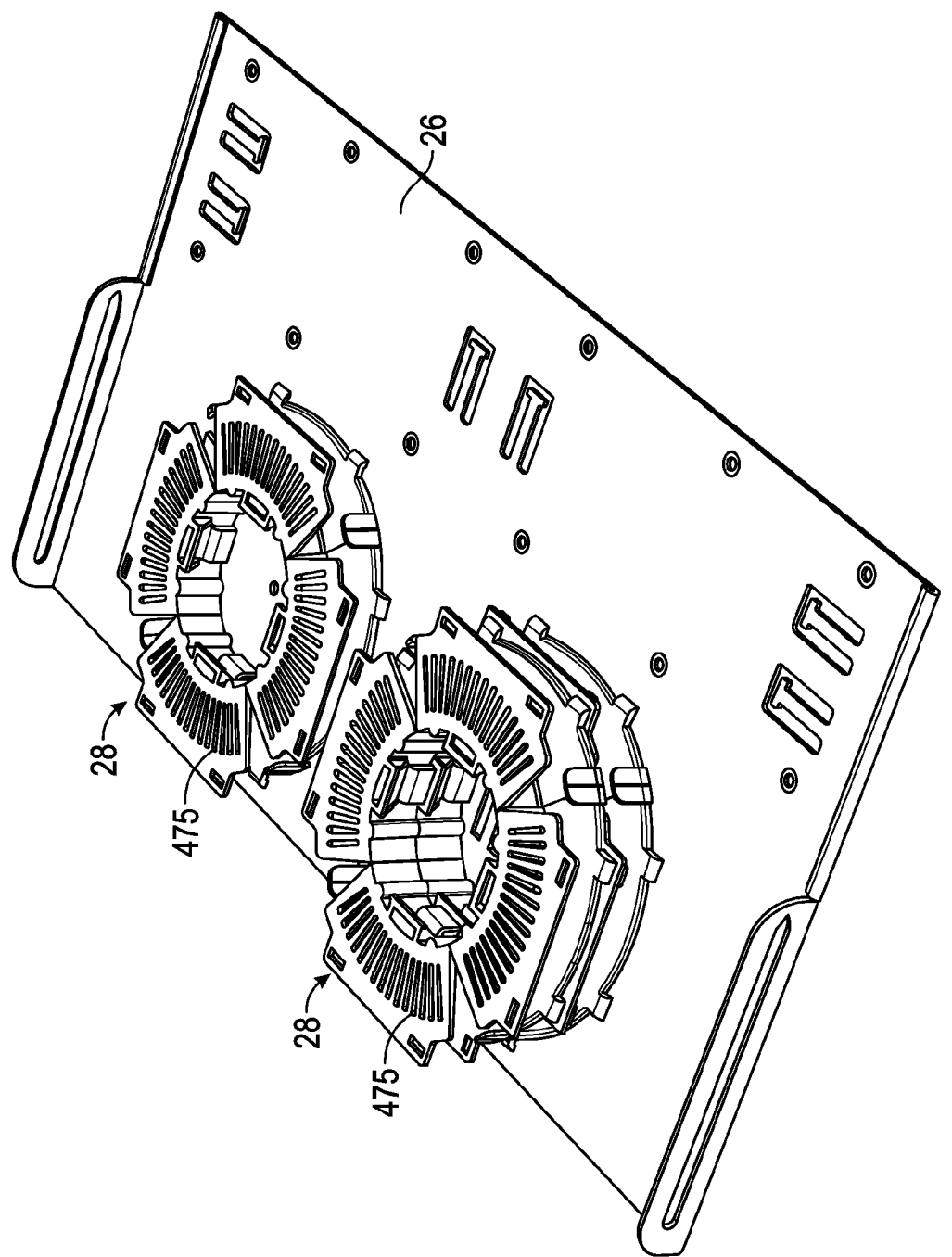
FIG. 46 is a perspective view of the exemplary spool assembly of FIG. 41 secured to upper cable management plate.

In some embodiments, quarter spool 475 can define an approximately ninety degree portion or circumference of a full spool 28. As shown in FIGS. 45 and 46, four quarter spools 475 can be individually interlocked relative to upper cable management plate 26 such that spools 28 are formed. Inner walls 478 of quarter spools 475 can mate to form a complete circumference around which cables can be wrapped.

In some embodiments, as shown in FIGS. 43, 44 and 46, top surface 476 of quarter spool 475 can include two slots 482 near the outer edge of quarter spool 475, and further includes a single slot 483 extending from the inner edge of quarter spool 475. It should be understood that slots 482 can be complementary to flanges 480 and slot 483 can be complementary to flange 481. Quarter spools 475 can thereby be stacked relative to each other to provide additional space onto which cables can be organized.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

The invention claimed is:

1. A cable management plate assembly for a media patching system or a rack, the cable management plate assembly comprising:
    a lower cable management plate; and
    an upper cable management plate slidably secured to the lower cable management plate, the upper cable management plate including a body with side edges and a flange extending from each of the side edges, each of the flanges including an elongated slot having an angled distal end formed by two converging linear lines;
    wherein in a first configuration, the upper cable management plate is disposed in a retracted position relative to the lower cable management plate; and
    wherein in a second configuration, the upper cable management plate is disposed in an extended position relative to the lower cable management plate.

2. The cable management plate assembly according to claim 1, wherein the body of the upper cable management plate defines a supporting surface.

3. The cable management plate assembly according to claim 2, wherein the upper cable management plate comprises slots formed therein for detachably receiving spools.

4. The cable management plate assembly according to claim 1, comprising fastening members passing through the elongated slots and secured to the lower cable management plate, the upper cable management plate sliding along the fastening members relative to the lower cable management plate.

5. The cable management plate assembly according to claim 4, wherein in the retracted position the upper cable management plate is slidably retracted relative to the lower cable management plate such that the fastening members are disposed adjacent to the distal end of the elongated slots.

6. The cable management plate assembly according to claim 4, wherein in the extended position the upper cable management plate is slidably extended relative to the lower cable management plate such that the fastening members are disposed adjacent to a proximal end of the elongated slots.

7. The cable management plate assembly according to claim 4, wherein in the extended position the upper cable management plate can rotate about the fastening members.

8. The cable management plate assembly according to claim 4, wherein the fastening members comprise a cam lock mechanism including a first cam portion and a second cam portion.

9. The cable management plate assembly according to claim 8, wherein the first cam portion is configured to impart a force on the second cam portion to create a friction force on the upper cable management plate, the friction force preventing sliding of the upper cable management plate relative to the lower cable management plate.

10. The cable management plate assembly according to claim 1, wherein the upper cable management plate comprises a tab formed therein for securing the one or more cables to the body.

11. The cable management plate assembly according to claim 1, wherein the lower cable management plate comprises two side flanges having holes that are spaced to allow the cable management plate assembly to be fixedly secured to either a patch panel enclosure or a rack.

12. A method of supporting one or more cables in a media patching system or a rack, the method comprising:
    securing a cable management assembly to the media patching system or the rack, the cable management assembly including an upper cable management plate slidably secured to a lower cable management plate, the upper cable management plate including a body with side edges and a flange extending from each of the side edges, each of the flanges including an elongated slot having an angled distal end formed by two converging linear lines;
    sliding the upper cable management plate relative to the lower cable management plate into a retracted position; and
    sliding the upper cable management plate relative to the lower cable management plate into an extended position.

13. The method according to claim 12, further comprising pivoting the upper cable management plate relative to the lower cable management plate.

14. The method according to claim 12, further comprising locking a position of the upper cable management plate relative to the lower cable management plate.

15. The method according to claim 12, further comprising locking a position of the upper cable management plate relative to the lower cable management plate by rotating one member of a cam lock mechanism to create a friction force on the upper cable management plate.

16. A media patching system, comprising:
    a patch panel enclosure including first and second frame members, and
    a cable management plate assembly disposed within the patch panel enclosure, the cable management plate assembly including a lower cable management plate and an upper cable management plate slidably secured to the lower cable management plate, the upper cable management plate including a body with side edges and a flanges extending from each of the side edges, each of the flanges including an elongated slot having an angled distal end formed by two converging linear lines;
    wherein in a first configuration, the upper cable management plate is disposed in a retracted position relative to the lower cable management plate and the patch panel enclosure; and
    wherein in a second configuration, the upper cable management plate is disposed in an extended position relative to the lower cable management plate and the patch panel enclosure.

17. The media patching system according to claim 16, wherein the lower cable management plate is fixedly secured to the first and second frame members of the patch panel enclosure and the upper cable management plate slides between the retracted position and the extended position relative to the lower cable management plate and the patch panel enclosure.

18. The media patching system according to claim 17, further comprising:
    a first bracket fixedly secured to the first frame member through a spring-loaded pin; and
    a second bracket fixedly secured to the second frame member though a spring-loaded pin;
    wherein the lower cable management plate is fixedly secured to the first and second frame members through the first and second brackets.

19. The media patching system according to claim 18, wherein the body of the upper cable management plate defines a supporting surface.

20. The media patching system according to claim 19, comprising fastening members passing through the elongated slots and secured to the lower cable management plate, the upper cable management plate sliding along the fastening members relative to the lower cable management plate.

* * * * *